US012702043B2

(12) United States Patent
     Lai et al.

(10) Patent No.: US 12,702,043 B2
(45) Date of Patent: Aug. 4, 2026

(54) HIGH-DENSITY MICROBUMP ARRAYS WITH ENHANCED ADHESION AND METHODS OF FORMING THE SAME

(71) Applicant: Taiwan Semiconductor Manufacturing Company Limited, Hsinchu (TW)

(72) Inventors: Yen-Kun Lai, New Taipei City (TW); Yi-Wen Wu, Xizhi City (TW); Kuo-Chin Chang, Chiayi City (TW); Po-Hao Tsai, Zhongli City (TW); Mirng-Ji Lii, Sinpu Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 582 days.

(21) Appl. No.: 17/748,358

(22) Filed: May 19, 2022

(65) Prior Publication Data

US 2023/0107847 A1 Apr. 6, 2023

Related U.S. Application Data

(60) Provisional application No. 63/252,655, filed on Oct. 6, 2021.

(51) Int. Cl.
     *H10W 72/90* (2026.01)
     *H10W 70/05* (2026.01)
     (Continued)

(52) U.S. Cl.
     CPC ......... *H10W 72/90* (2026.01); *H10W 70/093* (2026.01); *H10W 72/20* (2026.01);
     (Continued)

(58) Field of Classification Search
     None
     See application file for complete search history.

(56) References Cited

U.S. PATENT DOCUMENTS 6,489,229 B1 * 12/2002 Sheridan ................. H01L 24/05
                                                      438/615
2005/0258539 A1 * 11/2005 Minda ..................... H01L 24/03
                                                      257/E23.021
(Continued)

FOREIGN PATENT DOCUMENTS

TW          200934890 A      8/2009
TW          201413899 A      4/2014
          (Continued)

OTHER PUBLICATIONS

Taiwan Patent and Trademark Office, TW Application No. 111133811, Notice dated Nov. 6, 2023; 11 pages.
(Continued)

*Primary Examiner* — Julio J Maldonado
*Assistant Examiner* — Pinaki Das
(74) *Attorney, Agent, or Firm* — The Marbury Law Group, PLLC

(57) ABSTRACT

A semiconductor die may include metal interconnect structures located within interconnect-level dielectric material layers, bonding pads located on a topmost interconnect-level dielectric material layer, a dielectric passivation layer located on the topmost interconnect-level dielectric material layer, and metal bump structures extending through the dielectric passivation layer and located on the bonding pads. Each of the metal bump structures comprises a contoured bottom surface including a bottommost surface segment in contact with a top surface of a respective one of the bonding pads, a tapered surface segment in contact with a tapered sidewall of a respective opening through the dielectric passivation layer, and an annular surface segment that
(Continued)

overlies the dielectric passivation layer and having an inner periphery that is laterally offset inward from an outer periphery by a lateral offset distance that is at least 8% of a width of a respective underlying one of the bonding pads.

20 Claims, 35 Drawing Sheets

(51) Int. Cl.
      *H10W 70/652*      (2026.01)
      *H10W 72/20*       (2026.01)
      *H10W 90/00*       (2026.01)
(52) U.S. Cl.
      CPC ...... *H10W 70/6523* (2026.01); *H10W 90/724* (2026.01); *H10W 90/726* (2026.01)

(56) References Cited

U.S. PATENT DOCUMENTS

2007/0205520 A1* 9/2007 Chou ..................... H01L 24/12
                                                              257/E23.129

2010/0109159 A1* 5/2010 Ho ......................... H01L 24/13
                                                              257/737
2011/0285015 A1  11/2011 Song et al.
2011/0304042 A1* 12/2011 Lin ....................... H01L 23/488
                                                              257/737
2012/0018877 A1* 1/2012 Yang ................... H01L 23/5385
                                                              257/737
2012/0153460 A1  6/2012 Chi
2016/0300807 A1* 10/2016 Deng ..................... H01L 24/81
2019/0067104 A1* 2/2019 Huang ................... H01L 24/16
2020/0266163 A1  8/2020 Lee

FOREIGN PATENT DOCUMENTS

TW      201707176 A      2/2017
TW      201901822 A      1/2019

OTHER PUBLICATIONS

Taiwan Patent and Trademark Office, TW Application No. 111133811, Notice dated Jun. 27, 2023; 10 pages.

\* cited by examiner

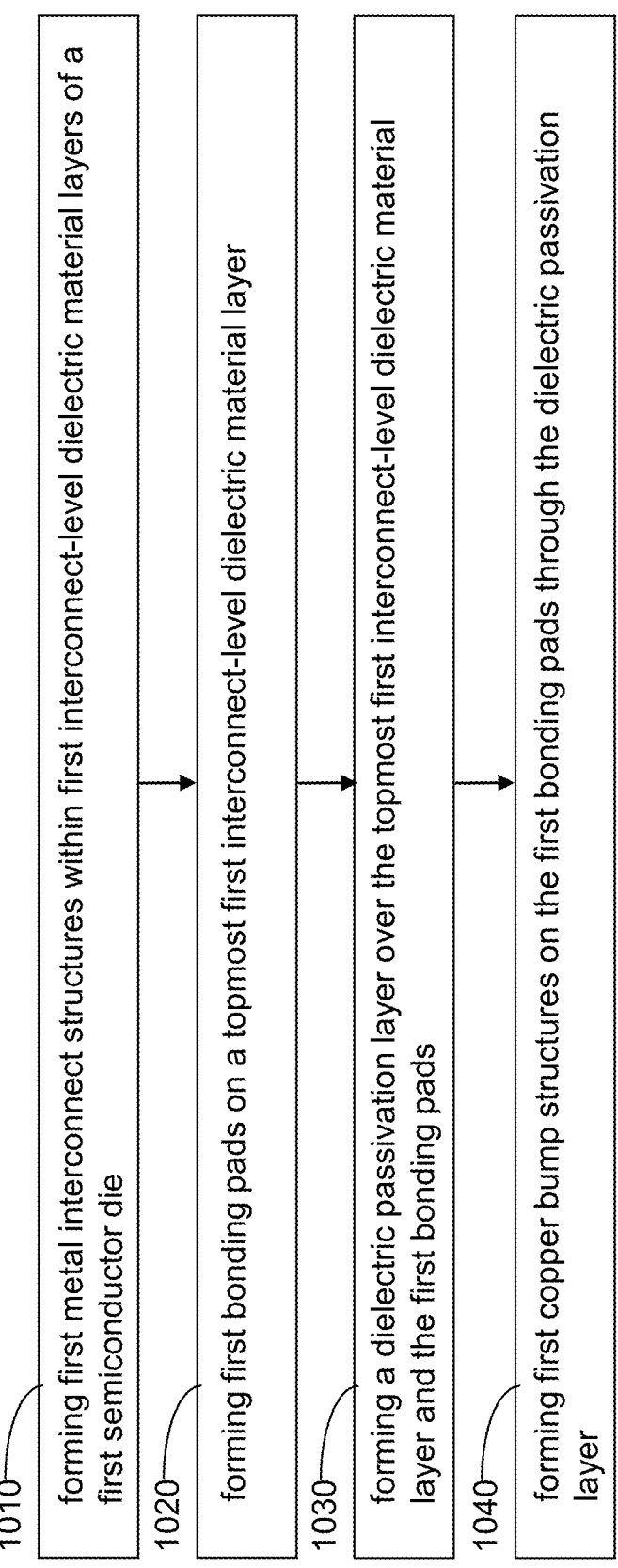

1010 — forming first metal interconnect structures within first interconnect-level dielectric material layers of a first semiconductor die 1020 — forming first bonding pads on a topmost first interconnect-level dielectric material layer 1030 — forming a dielectric passivation layer over the topmost first interconnect-level dielectric material layer and the first bonding pads 1040 — forming first copper bump structures on the first bonding pads through the dielectric passivation layer

FIG. 10

HIGH-DENSITY MICROBUMP ARRAYS WITH ENHANCED ADHESION AND METHODS OF FORMING THE SAME

RELATED APPLICATIONS

This application claims the benefit of priority from U.S. Provisional Application Ser. No. 63/252,655 titled "A Micro Bump Configuration on RDL to Improve Package Reliability and Methods of Forming the Same" and filed on Oct. 6, 2021, the entire contents of which are incorporated herein by reference.

BACKGROUND

Micrometal bump structures are used to provide high-density electrical connection between a semiconductor die and an interposer, between a pair of semiconductor dies, and/or between a semiconductor die and a packaging substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a flowchart illustrating steps for forming a semiconductor structure according to an embodiment of the present disclosure.

DETAILED DESCRIPTION

Figure 1:
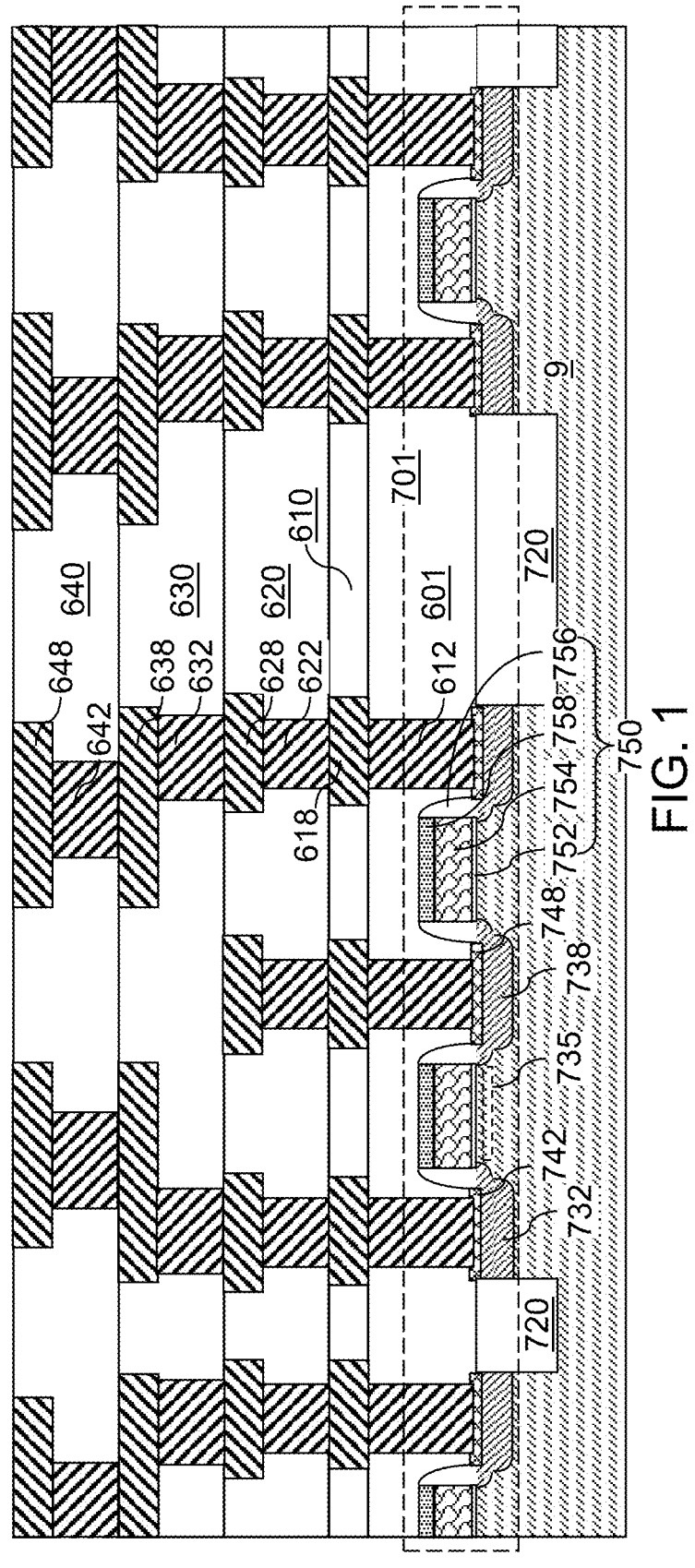
FIG. 1 is a vertical cross-sectional view of a region of an exemplary structure after formation of complementary metal-oxide-semiconductor (CMOS) transistors, and metal interconnect structures embedded in dielectric material layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a semiconductor die including stress-resistant bonding structures and method of forming the same, the various aspects of which are now described in detail.

Generally, the various embodiment methods and structures disclosed herein may be used to provide a semiconductor die including a high-density array of microbumps. According to an aspect of the present disclosure, adhesion between the microbumps and underlying structures may be enhanced by increasing contact areas between the microbumps and a dielectric passivation layer. The microbumps may comprise contoured bottom surfaces including annular surface segments that increase adhesion to an underlying material layer, which may comprise the dielectric passivation layer and/or a capping dielectric material layer. The various aspects of the methods and structures of embodiments of the present disclosure are now described with reference to the accompanying drawings.

FIG. 1 is a vertical cross-sectional view of an exemplary structure after formation of complementary metal-oxide-semiconductor (CMOS) transistors, metal interconnect structures embedded in dielectric material layers, and a connection-via-level dielectric layer according to an embodiment of the present disclosure. The exemplary structure includes complementary metal-oxide-semiconductor (CMOS) transistors and metal interconnect structures formed in dielectric material layers. Specifically, the exemplary structure includes a semiconductor substrate 9, which may be a semiconductor substrate such as a commercially available silicon wafer. Shallow trench isolation structures 720 including a dielectric material such as silicon oxide may be formed in an upper portion of the semiconductor substrate 9. Suitable doped semiconductor wells, such as p-type wells and n-type wells, may be formed within each area that may be laterally enclosed by a portion of the shallow trench isolation structures 720. Field effect transistors may be formed over the top surface of the semiconductor substrate 9. For example, each field effect transistor may include a source region 732, a drain region 738, a semiconductor channel 735 that includes a surface portion of the semiconductor substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738. While planar field effect transistors are illustrated in the drawings, embodiments are expressly contemplated herein in which the field effect transistors may additionally or alternatively include fin field effect transistors (FinFET), gate-all-around field effect (GAA FET) transistors, or any other type of field effect transistors (FETs).

The devices formed on the top surface of the semiconductor substrate 9 may include field effect transistors 701 such as complementary metal-oxide-semiconductor (CMOS) transistors. Additional semiconductor devices (such as resistors, diodes, capacitors, etc.) may be formed on the semiconductor substrate 9.

Various metal interconnect structures (which are also referred to as first metal interconnect structures) embedded in dielectric material layers (which are also referred to as first dielectric material layers) may be subsequently formed over the semiconductor substrate 9 and the devices (such as field effect transistors). The dielectric material layers may include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures may include device contact via structures 612 formed in the contact-level dielectric material layer 601 and contact a respective component of the field effect transistors 701, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 formed in an upper portion of the fourth line-and-via-level dielectric material layer 640.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic fill materials within the contemplated scope of disclosure may also be used. In one embodiment, the first metal via structures 622 and the second metal line structures 628 may be formed as integrated line and via structures by a dual damascene process, the second metal via structures 632 and the third metal line structures 638 may be formed as integrated line and via structures, and/or the third metal via structures 642 and the fourth metal line structures 648 may be formed as integrated line and via structures. While the present disclosure is described using an embodiment in which an array of memory cells formed over the fourth line-and-via-level dielectric material layer 640, embodiments are expressly contemplated herein in which the array of memory cells may be formed at a different metal interconnect level.

The dielectric material layers (601, 610, 620, 630, 640) may be located at a lower level relative to an array of memory cells to be subsequently formed. As such, the dielectric material layers (601, 610, 620, 630, 640) are herein referred to as lower-level dielectric layers, i.e., dielectric material layer located at a lower level relative to the array of memory cells to be subsequently formed. The metal interconnect structures (612, 618, 622, 628, 632, 638, 642, 648) are herein referred to as lower-level metal interconnect structures. A subset of the metal interconnect structures (612, 618, 622, 628, 632, 638, 642, 648) includes lower-level metal lines (such as the fourth metal line structures 648) that are embedded in the lower-level dielectric layers and having top surfaces within a horizontal plane including a topmost surface of the lower-level dielectric layers. Generally, the total number of metal line levels within the lower-level dielectric layers (601, 610, 620, 630, 640) may be in a range from 1 to 10.

FIGS. 2A-2J are sequential vertical cross-sectional view of a portion of a first configuration of the exemplary structure during formation of bonding pads, a dielectric passivation layer, a capping dielectric material layer, metal bump structures, and solder material portions according to an embodiment of the present disclosure.

Figure 2A:
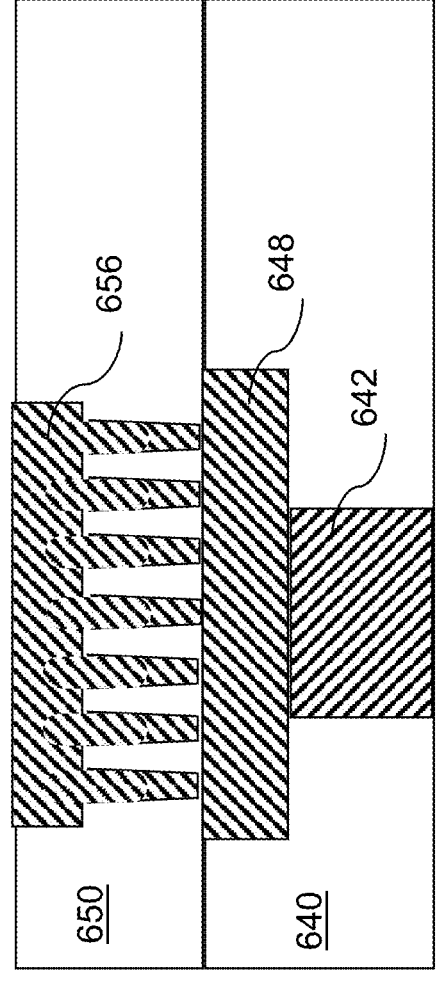
FIGS. 2A-2K are sequential vertical cross-sectional view of a portion of a first configuration of the exemplary structure during formation of bonding pads, a dielectric passivation layer, a capping dielectric material layer, metal bump structures, and solder material portions according to an embodiment of the present disclosure.

Referring to FIG. 2A, additional metal interconnect levels may be used to provide stress-absorption structures such as multi-via support structures (648, 656). Each multi-via support structure (648, 656) may be designed to distribute a mechanical stress transmitted from an overlying connection via structure to be subsequently formed over an area larger than the area of the overlying connection via structure. For example, each multi-via support structure (648, 656) may include a bottom metallic plate (which may be, for example, a fourth metal line structures 648), and an integrated plate and via assembly 656 that may be formed in a dielectric material layer such as a fifth line-and-via-level dielectric material layer 650. The integrated plate and via assembly 656 may include a top metallic plate and a plurality of metallic via structures that are adjoined to the top metallic plate and contacting a top surface of the bottom metallic plate. The integrated plate and via assemblies 656 may be formed by patterning an array of via cavities through the fifth line-and-via-level dielectric material layer 650 over each area of the bottom metallic plates, by depositing at least one metallic material in the array of via cavities and over the fifth line-and-via-level dielectric material layer 650, and by patterning the at least one metallic material. Each integrated plate and via assembly 656 may have a planar top surface, i.e., a top surface located entirely within a horizontal plane.

Figure 2B:
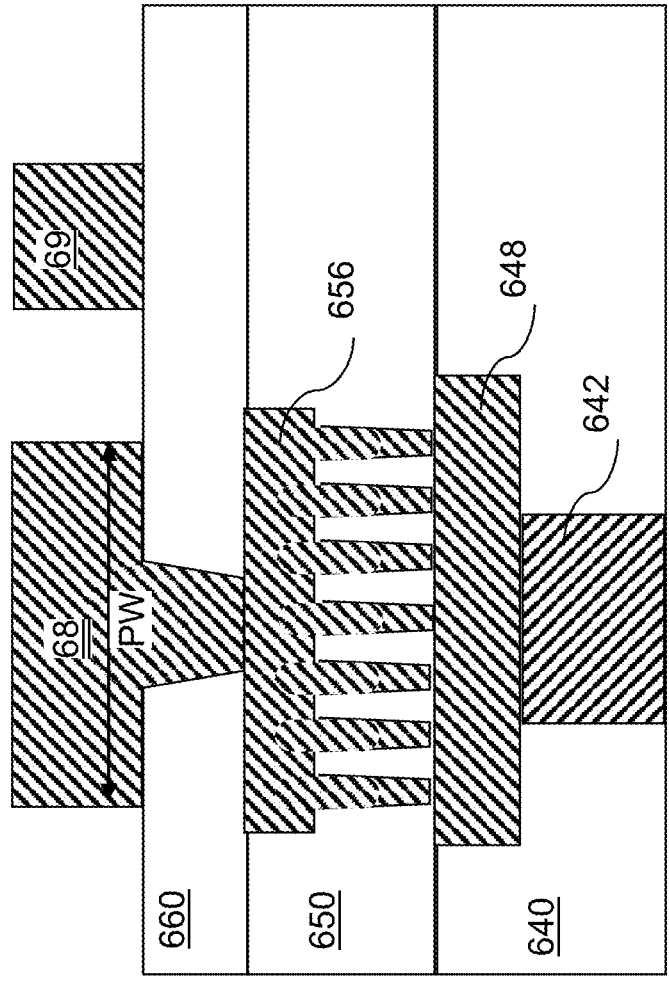

Referring to FIG. 2B, another dielectric material layer, which is herein referred to as a topmost interconnect-level dielectric material layer 660, may be deposited over the fifth line-and-via-level dielectric material layer 650 and fifth metal interconnect structures (which include the integrated plate and via assemblies 656). The topmost interconnect-level dielectric material layer 660 may also be referred to as a first topmost interconnect-level dielectric material layer. The topmost interconnect-level dielectric material layer 660 may include any material that may be used for the underlying interconnect-level dielectric material layers. The thickness of the topmost interconnect-level dielectric material layer 660 may be in a range from 2 microns to 20 microns, although lesser and greater thicknesses may also be used.

A connection via cavity may be formed over each of the integrated plate and via assemblies 656 through the topmost interconnect-level dielectric material layer 660, for example, by applying and patterning a photoresist layer and by transferring the pattern in the photoresist layer through the topmost interconnect-level dielectric material layer 660 by performing an etch process such as a reactive ion etch process. A top surface of an integrated plate and via assembly 656 may be physically exposed at the bottom of each connection via cavity. The maximum lateral dimension of each connection via cavity, such as a diameter of an upper periphery of each connection via cavity, may greater than twice the thickness of a metallic material layer to be subsequently deposited thereupon. For example, the maximum lateral dimension of each connection via cavity may be in a range from 1 microns to 20 microns, such as from 2 microns to 15 microns, although lesser and greater maximum lateral dimensions may also be used.

At least one metallic material such as Cu, Mo, Co, Ru, W, TiN, TaN, WN, or a combination or a stack thereof may be deposited in the connection via cavities and over the top surface of the topmost interconnect-level dielectric material layer 660, for example, by physical vapor deposition. The at least one metallic material may be patterned, for example, by applying a photoresist layer over the at least one metallic material and by transferring the pattern in the photoresist layer through the at least one metallic material. Patterned portions of the at least one metallic material comprise bonding pads 68 that contact a respective one of the multi-via support structures (648, 656). The bonding pads 68 are also referred to as first bonding pads.

Each bonding pad 68 may comprise a connection via portion located within a respective connection via cavity below a horizontal plane including a top surface of the topmost interconnect-level dielectric material layer 660 and a pad plate portion that contacts a horizontal top surface of the topmost interconnect-level dielectric material layer 660 and located above the horizontal plane including the top surface of the topmost interconnect-level dielectric material layer 660. Each connection via portion of the bonding pads 68 vertically extends through the topmost interconnect-level dielectric material layer 660, and each pad plate portion of the bonding pads 68 overlies the topmost interconnect-level dielectric material layer 660.

The maximum lateral dimension between parallel facing pairs of sidewall segments of each bonding pad 68 is herein referred to as a pad width PW. The pad width PW of each bonding pad 68 may be in a range from 2 micron to 40 microns, such as from 3 microns to 20 microns, although lesser and greater pad widths PW may also be used. Optionally, pad-level metal structures 69 may be formed, which may comprise metal interconnect structures (such as metal lines) and/or inductor structures. In one embodiment, the bonding pads 68 may comprise, and/or may consist essentially of, copper. The thickness of the bonding pads 68 may be in a range from 2 microns to 10 microns, although lesser and greater thicknesses may also be used. The bonding pads 68 may have a horizontal cross-sectional shape of a rectangle, a circle, or a rounded rectangle. Generally, the bonding pads 68 may be located on the topmost interconnect-level dielectric material layer 660, and may be electrically connected to a respective one of the metal interconnect structures that are embedded within the interconnect-level dielectric material layers (610, 620, 630, 640, 650, 660).

Figure 2C:
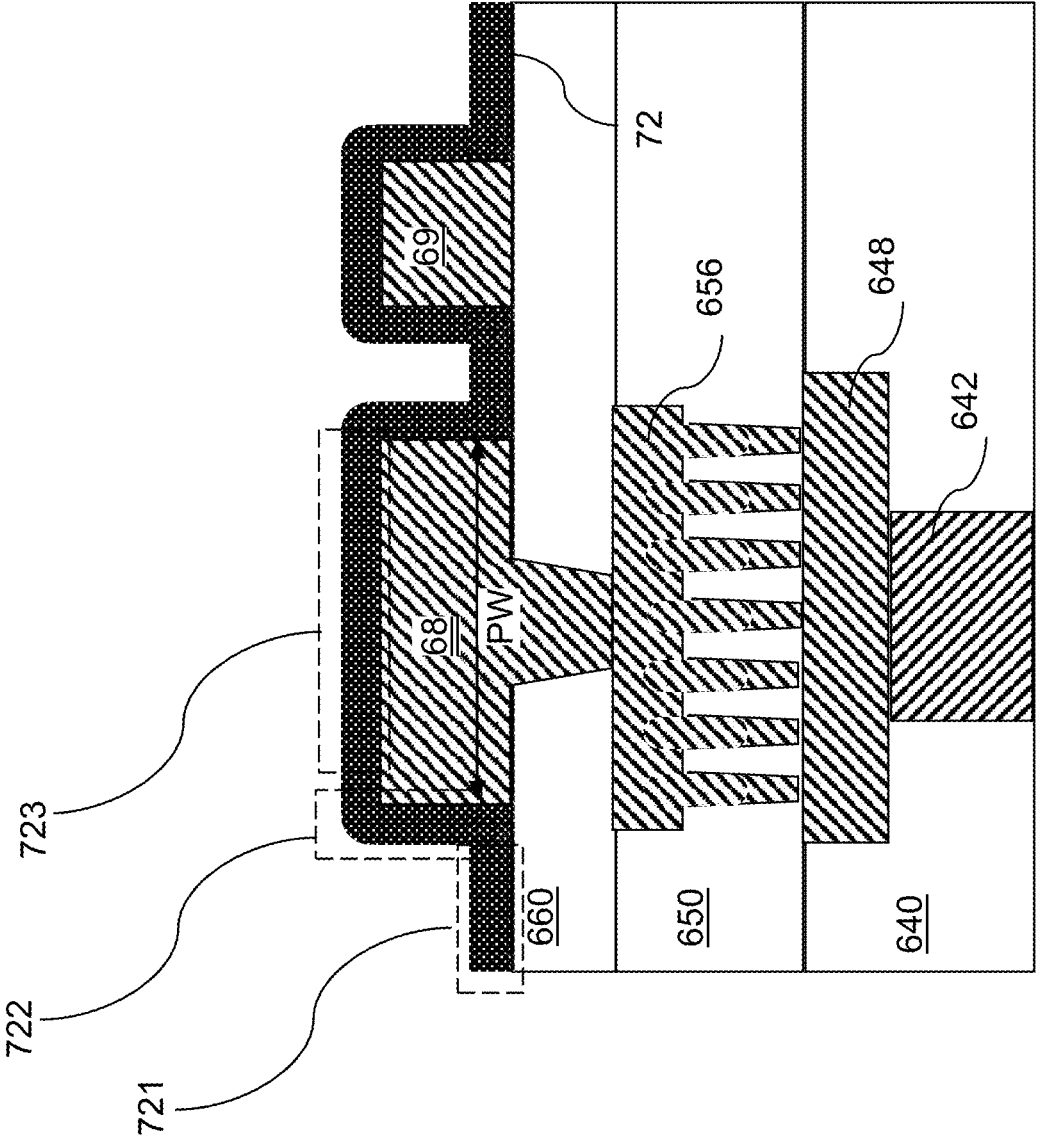

Referring to FIG. 2C, a dielectric passivation layer 72 may be formed directly on, and over, the topmost interconnect-level dielectric material layer 660 and the bonding pads 68. The dielectric passivation layer 72 comprises, and/or consists essentially of, a dielectric passivation material blocking diffusion of hydrogen and moisture. In one embodiment, the dielectric passivation material of the dielectric passivation layer 72 may be selected from silicon nitride and silicon carbide nitride. In one embodiment, the dielectric passivation layer 72 may be formed by a conformal deposition process such as a chemical vapor deposition process. The thickness of the dielectric passivation layer 72 may be in a range from 100 nm to 1,000 nm, such as from 200 nm to 500 nm, although lesser and greater thicknesses may also be used.

In one embodiment, the dielectric passivation layer 72 comprises a horizontally-extending segment 721 contacting the topmost interconnect-level dielectric material layer 660, vertically-extending segments 722 contacting sidewalls of the bonding pads 68, and capping segments 723 contacting top surfaces of the bonding pads 68. Each capping segment 723 may contact an entirety of the top surface of a respective underlying bonding pad 68. Outer sidewalls of the vertically-extending segments 722 of the dielectric passivation layer 72 may be physically exposed.

Figure 2D:
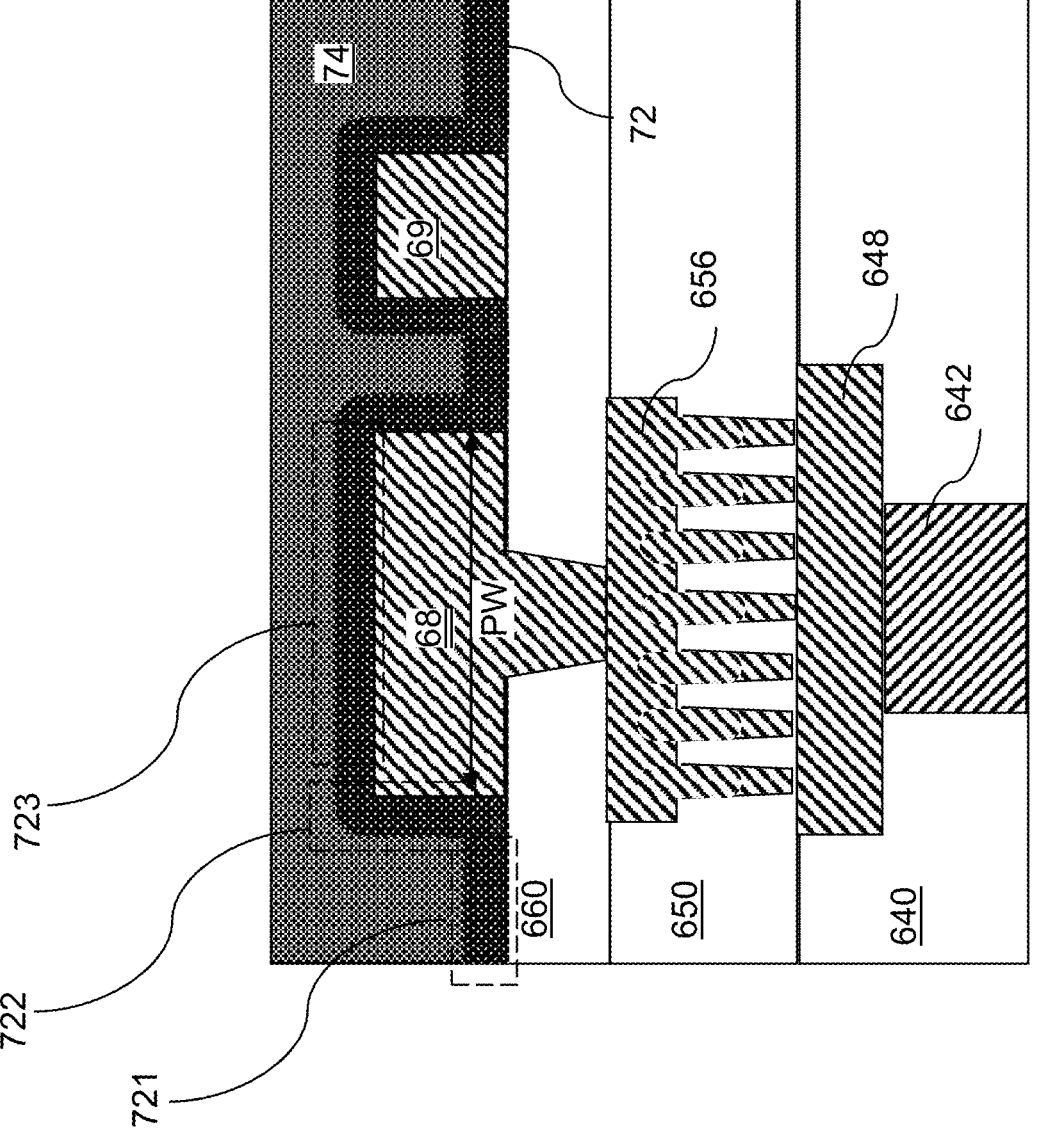

Referring to FIG. 2D, a capping dielectric material layer 74 may be formed over the dielectric passivation layer 72, for example, by deposition of a capping dielectric material and subsequent planarization of the capping dielectric material. The planarization of the capping dielectric material may be performed by a recess etch process or by a chemical mechanical polishing process. In one embodiment, an entirety of the top surface of the capping dielectric material layer 74 may be formed within a horizontal plane. The vertical distance between the topmost surfaces (such as the top surfaces of the capping segments 723) of the dielectric passivation layer 72 and the top surface of the capping dielectric material layer 74 may be in a range from 100 nm to 2 microns, such as from 200 nm to 1.5 micron and/or from 300 nm to 1 micron, although lesser and greater vertical distances may also be used. In one embodiment, the ratio of the vertical distance between the topmost surfaces of the dielectric passivation layer 72 and the top surface of the capping dielectric material layer 74 to the thickness of the dielectric passivation layer 72 may be greater than 1.0, and may be in a range from 1.0 to 3.0.

In one embodiment, the capping dielectric material layer 74 may comprise an additional dielectric passivation material blocking diffusion of hydrogen and moisture. In one embodiment, the additional dielectric passivation material of the capping dielectric material layer 74 may be selected from silicon nitride and silicon carbide nitride. In one embodiment, the additional dielectric passivation material of the capping dielectric material layer 74 may be different from the dielectric passivation material of the dielectric passivation layer 72. In one embodiment, the dielectric passivation layer 72 comprises silicon nitride, and the capping dielectric material layer 74 comprises silicon carbide nitride. In another embodiment, the dielectric passivation layer 72 comprises silicon carbide nitride, and the capping dielectric material layer 74 comprises silicon nitride.

Figure 2E:
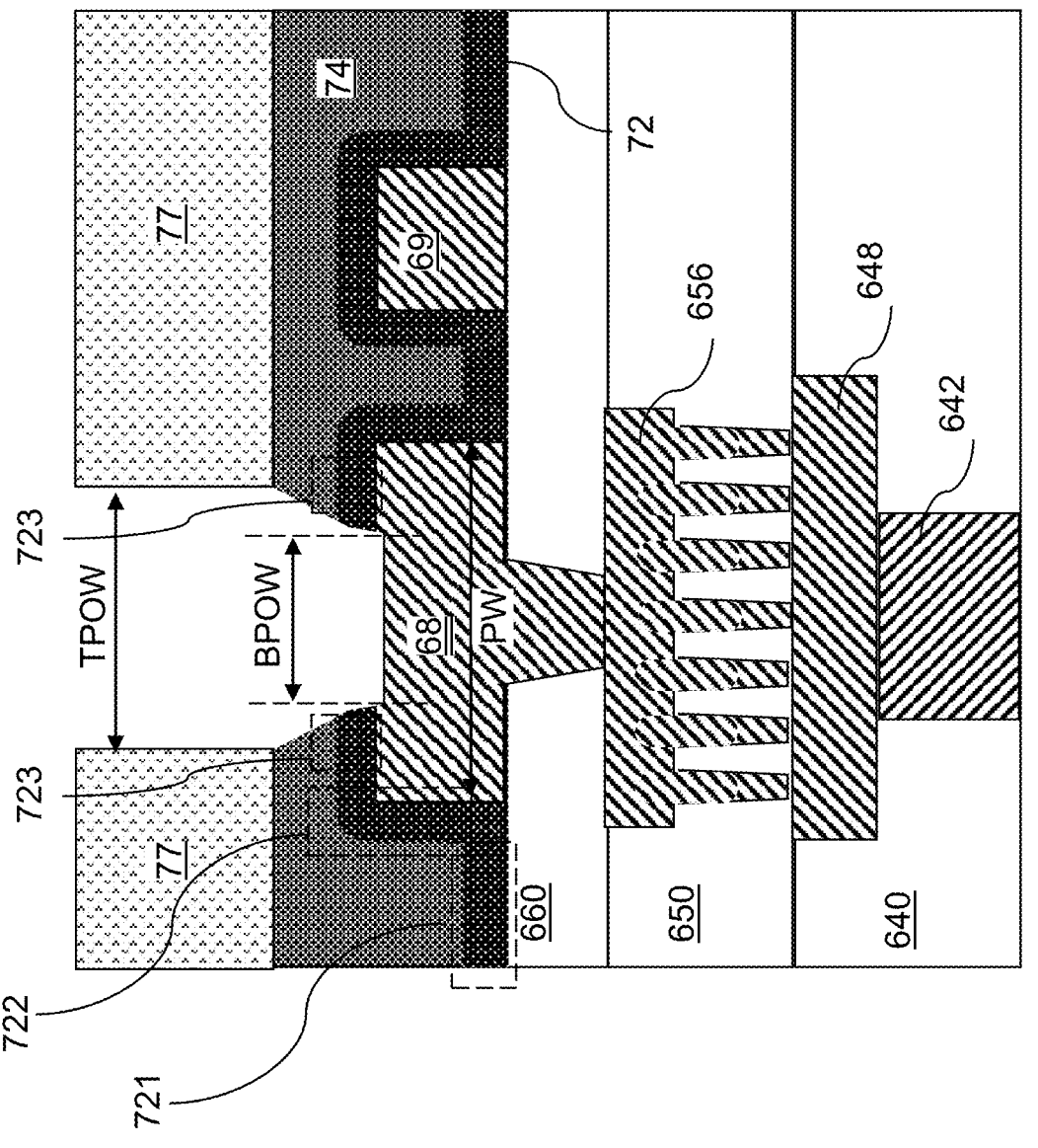

Referring to FIG. 2E, a photoresist layer 77 may be applied over the capping dielectric material layer 74, and may be lithographically patterned to form openings therein. In one embodiment, the bonding pads 68 may be formed as a two-dimensional periodic array of bonding pads 68 such as a rectangular periodic array or a hexagonal periodic array. In this case, the openings in the photoresist layer 77 may have the same two-dimensional periodicity as the underlying two-dimensional array of bonding pads 68. In one embodiment, the shape of each opening through the photoresist layer 77 may be circular, and may have a diameter that is less than the pad width PW of the bonding pads 68. In one embodiment, the area of each opening through the photoresist layer 77 may be located entirely within the area of an underlying bonding pad 68 in a plan view (such as a top-down view). In one embodiment, the entirety of the periphery of each opening through the photoresist layer 77 may be laterally offset inward from the sidewalls of the underlying bonding pad 68. In one embodiment, the ratio of the diameter of an opening in the photoresist layer 77 to the pad width PW of an underlying bonding pad 68 to may be in a range from 0.5 to 0.80, although lesser and greater ratios may also be used.

An anisotropic etch process may be performed to transfer the pattern of the openings in the photoresist layer 77 through the underlying portions of the capping dielectric material layer 74 and the dielectric passivation layer 72. Openings having tapered surfaces may be formed through the capping dielectric material layer 74 and the dielectric passivation layer 72. Generally, the taper angle of the tapered sidewalls of the capping dielectric material layer 74 and the taper angle of the tapered sidewalls of the dielectric passivation layer 72 may be the same or different. The taper angle (as measured from a vertical direction) of the tapered sidewalls of the capping dielectric material layer 74 may be in a range from 30 degrees to 75 degrees, such as from 40 degrees to 65 degrees, although lesser and greater taper angles may also be used. The taper angle (as measured from a vertical direction) of the tapered sidewalls of the dielectric passivation layer 72 may be in a range from 35 degrees to 80 degrees, such as from 45 degrees to 70 degrees, although lesser and greater taper angles may also be used. In one embodiment, the taper angle of the tapered sidewalls of the dielectric passivation layer 72 may be greater than the taper angle of the tapered sidewalls of the capping dielectric material layer 74.

A planar top surface portion of each bonding pad 68 may be physically exposed after the anisotropic etch process. In one embodiment, each physically exposed planar top surface portion of the bonding pads 68 may have a circular shape with a diameter, which is herein referred to as a bottom pad opening width BPOW. The ratio of the bottom pad opening width BPOW to the pad width PW may be in a range from 0.3 to 0.7, such as from 0.35 to 0.65, although lesser and grater ratios may also be used.

Referring to FIG. 2E, a selective etch process may be optionally performed to recess physically exposed surfaces of the capping dielectric material layer 74 selective to the dielectric passivation layer 72. The recess distance of the capping dielectric material layer 74 may be in a range from 1 nm to 100 nm, such as from 3 nm to 50 nm, although lesser and greater recess distances may be used. The selective etch process may comprise an isotropic etch process or an anisotropic etch process. In an alternative embodiment, the selective etch process may be performed after the anisotropic etch process of FIG. 2D prior to removal of the patterned photoresist layer 77.

Figure 2F:
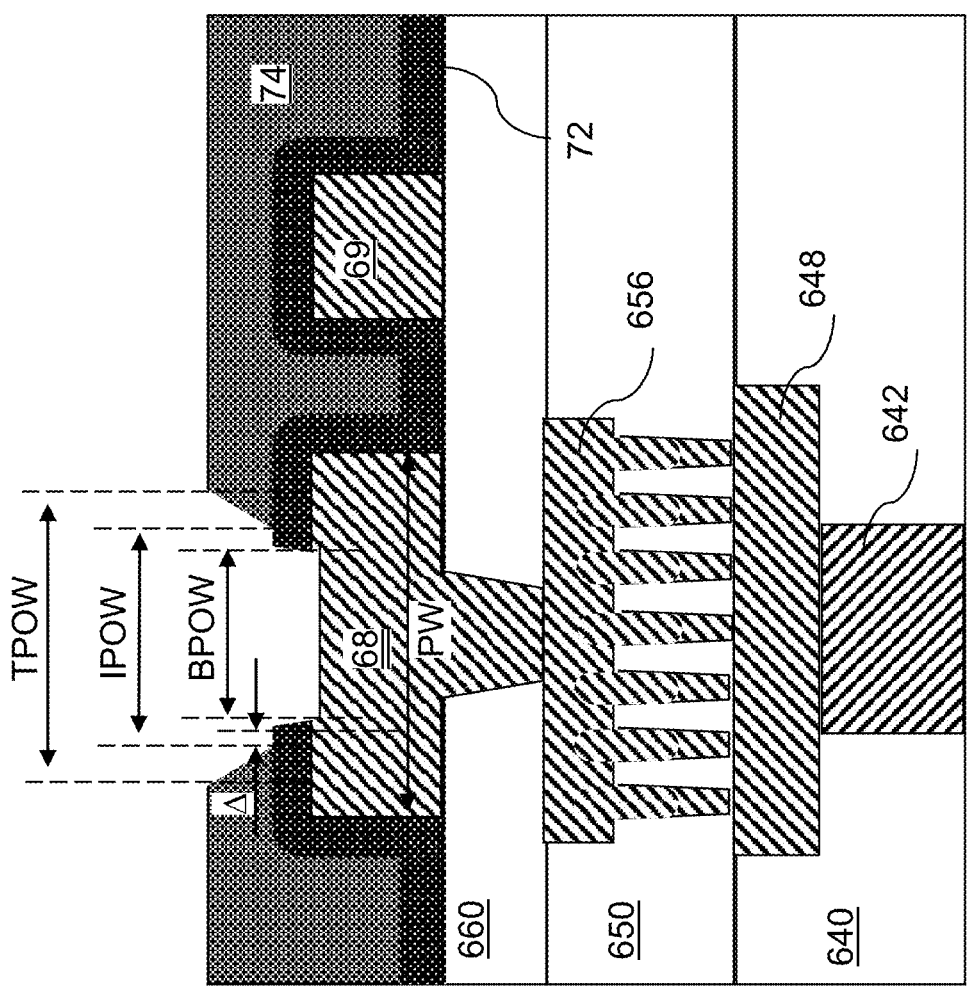

Referring to FIG. 2F, A top periphery of each tapered opening through the capping dielectric material layer 74 may be circular, and may have a lateral dimension (i.e., a diameter) that is herein referred to as a top pad opening width TPOW. The ratio of the top pad opening width TPOW to the bottom pad opening width BPOW may be in a range from 1.13 to 1.30, such as from 1.16 to 1.24, although lesser and greater ratios may also be used. The photoresist layer 77 may be removed, for example, by ashing.

A top periphery of each tapered opening through the dielectric passivation layer 72 may be circular, and may have a lateral dimension (i.e., a diameter) that is herein referred to as an intermediate pad opening width IPOW. A bottom periphery of each tapered opening through the dielectric passivation layer 72 may be circular, and may have a lateral dimension (i.e., a diameter) that is herein referred to as a bottom pad opening width BPOW. A lateral offset Δ may be present between a bottom periphery of a tapered opening through the capping dielectric material layer 74 and the top periphery of an underlying tapered opening through the dielectric passivation layer 72. The A lateral offset Δ may be the same as the recess distance of the selective etch process, and may be in a range from 1 nm to 100 nm, such as from 3 nm to 50 nm, although lesser and greater recess distances may be used.

Figure 2G:
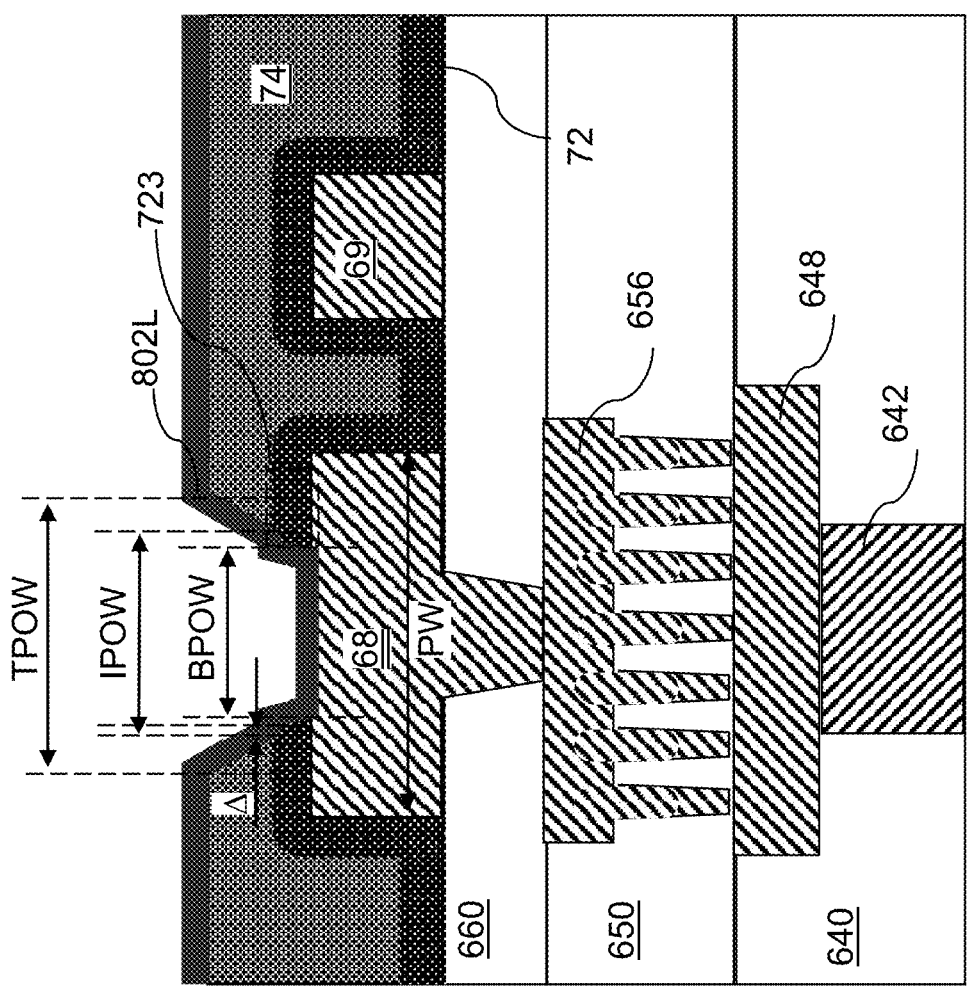

Referring to FIG. 2G, a continuous metallic seed layer 802L may be deposited over, and directly on, the physically exposed surfaces of the dielectric passivation layer 72, the capping dielectric material layer 74, and the bonding pads 68. The continuous metallic seed layer 802L includes a continuous metallic seed material such as Ti, Ta, W, TiN, TaN, or WN. In one embodiment, the continuous metallic seed layer 802L may be deposited by physical deposition process. The continuous metallic seed layer 802L may be deposited in the openings through the capping segments 723 of the dielectric passivation layer 72 and on physically exposed surfaces of the bonding pads 68. The thickness of the continuous metallic seed layer 802L may be in a range from 30 nm to 300 nm, although lesser and greater thicknesses may also be used.

Figure 2H:
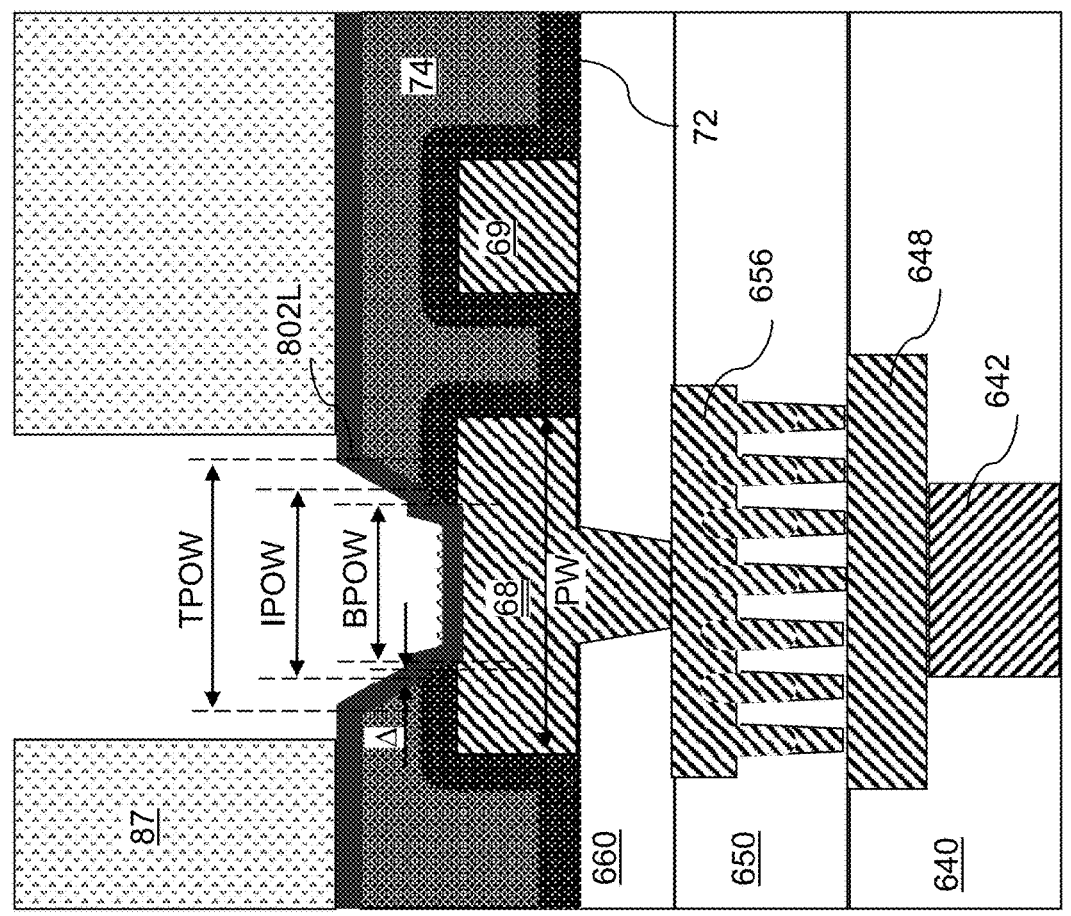

Referring to FIG. 2H, a photoresist layer 87 may be formed over the continuous metallic seed layer 802L, and may be lithographically patterned to form openings over each of the openings through the capping dielectric material layer 74. The thickness of the photoresist layer 87 may be greater than the height of the copper pillar structures to be subsequently formed. For example, the thickness of the photoresist layer 87 as measured over the top surface of the capping dielectric material layer 74 may be in a range from 2 micron to 30 microns, such as from 3 microns to 20 microns, although lesser and greater thicknesses may also be used. In one embodiment, openings in the photoresist layer 87 may have a respective shape of a circular cylindrical pillar having a diameter, which is herein referred to as a bump width BW. In one embodiment, each opening in the photoresist layer 87 may have a respective periphery that is located entirely within the area of an underlying bonding pad PW.

Figure 2I:
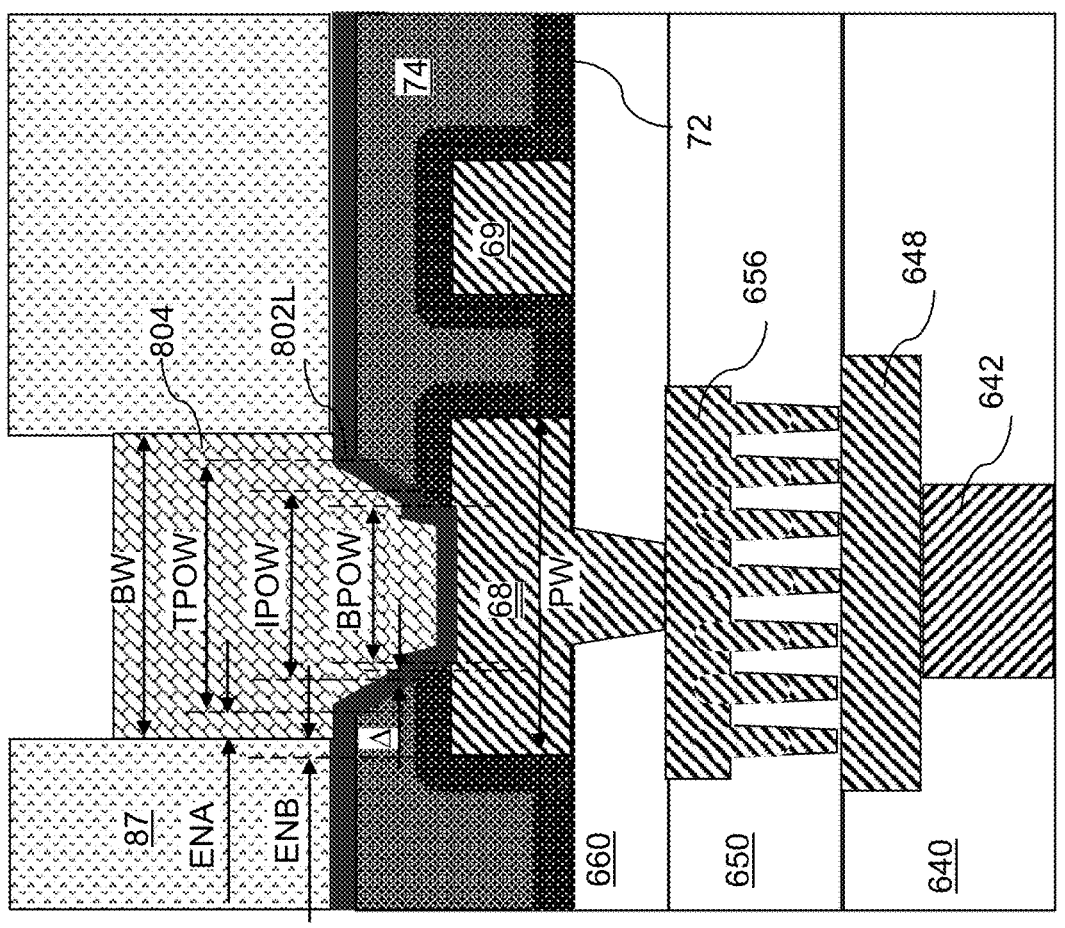

Referring to FIG. 2I, copper pillar structures 804 may be formed within the openings in the photoresist layer 87 directly on physically exposed metallic surfaces of the continuous metallic seed layer 802L, for example, by electroplating. Each electroplate material portion located within a respective opening in the photoresist layer 87 constitutes a copper pillar structure 804. Each copper pillar structure 804 may have a diameter of the bump width BW. The ratio of the pad width PW to the bump width BW may be in a range from 1.01 to 1.60, although lesser and greater ratios may also be used. The copper pillar structures 804 may have the same two-dimensional periodicity as the bonding pads 68. The ratio of the pad width PW to the periodicity of the two-dimensional array of bonding pads 68 in any direction of periodicity may be in a range from 0.20 to 0.50, although lesser and greater ratios may also be used.

The lateral offset distance between the sidewall of a copper pillar structure 804 and a vertical plane including a most proximal portion of a top periphery of a tapered sidewall of an underlying opening through the capping dielectric material layer 74 is herein referred to as a first lateral offset distance ENA. In one embodiment, the ratio of the first lateral offset distance ENA to the pad width PW is greater than 0.08, and may be in a range from 0.08 to 0.20, such as from 0.11 to 0.16. According to an aspect of the present disclosure, selection of the ratio of the first lateral offset distance ENA to the pad width PW within the range from 0.08 to 0.20 enhances adhesion of the metal bump structures to be formed to the dielectric passivation layer 72 and the capping dielectric material layer 74.

The lateral offset distance between the sidewall of a copper pillar structure 804 and a vertical plane including a most proximal sidewall of an underlying bonding pad 68 is herein referred to as a second lateral offset distance ENB. In one embodiment, the ratio of the second lateral offset distance ENB to the pad width PW is greater than 0.07, and may be in a range from 0.07 to 0.18, such as from 0.10 to 0.15. According to an aspect of the present disclosure, selection of the ratio of the second lateral offset distance ENB to the pad width PW within the range from 0.07 to 0.18 enhances adhesion of the metal bump structures to be formed to the dielectric passivation layer 72 and the capping dielectric material layer 74.

Figure 2J:
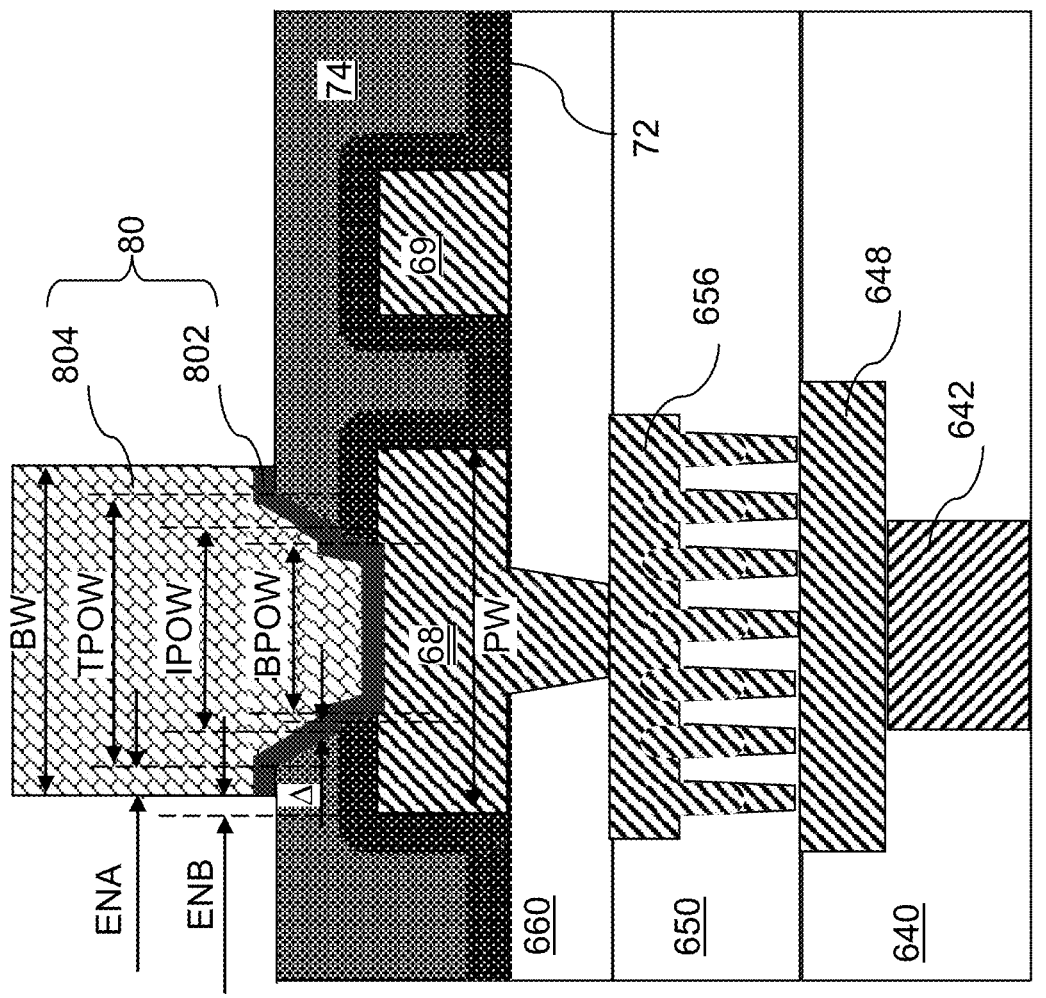

Referring to FIG. 2J, the photoresist layer 87 may be removed selective to the copper pillar structures 804 and the continuous metallic seed layer 802L, for example, by ashing. An etch process may be performed to etch physically exposed portions of the continuous metallic seed layer 802L. The etch process may comprise an anisotropic etch process or an isotropic etch process. Each patterned portion of the continuous metallic seed layer 802L comprises a metallic seed layer 802. Each contiguous combination of a metallic seed layer 802 and a copper pillar structure 804 constitutes a metal bump structure 80.

Figure 2K:
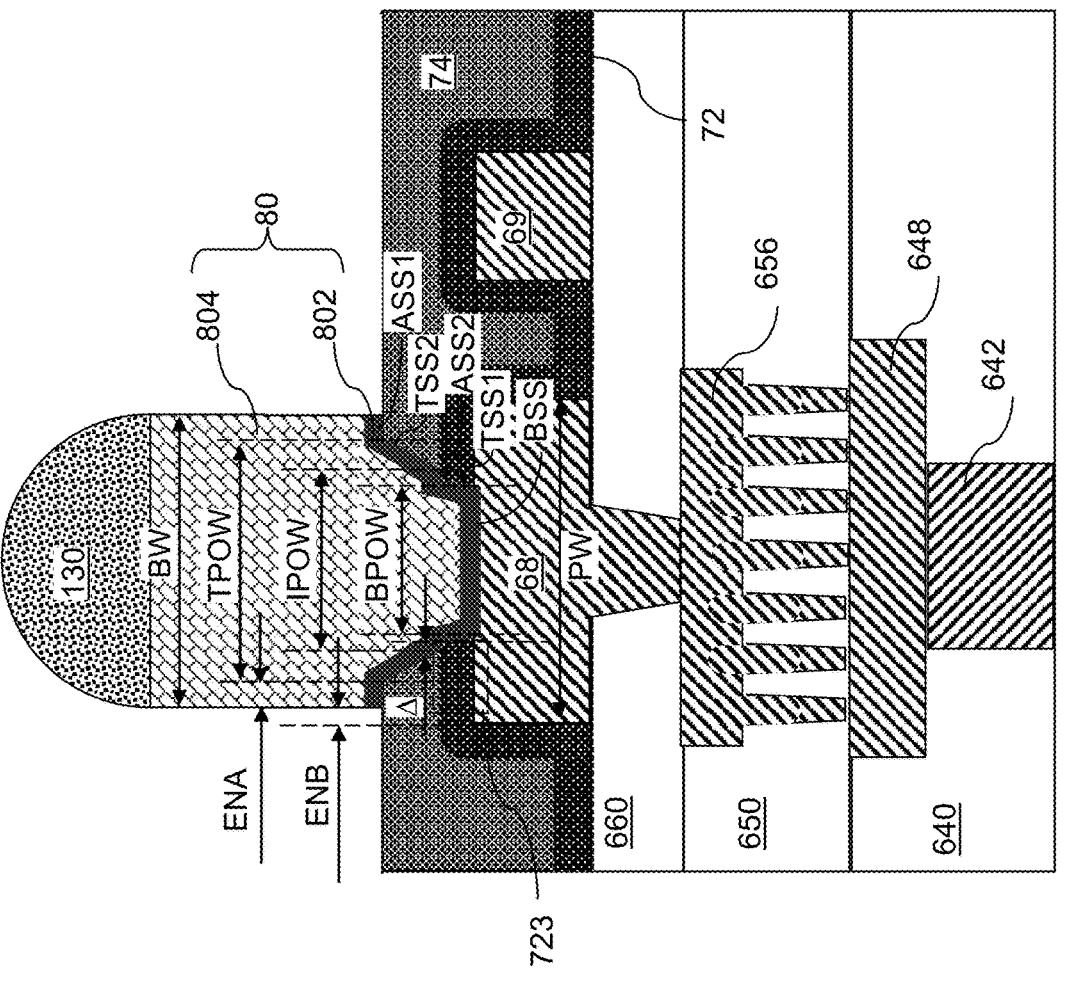
Figure 2L:
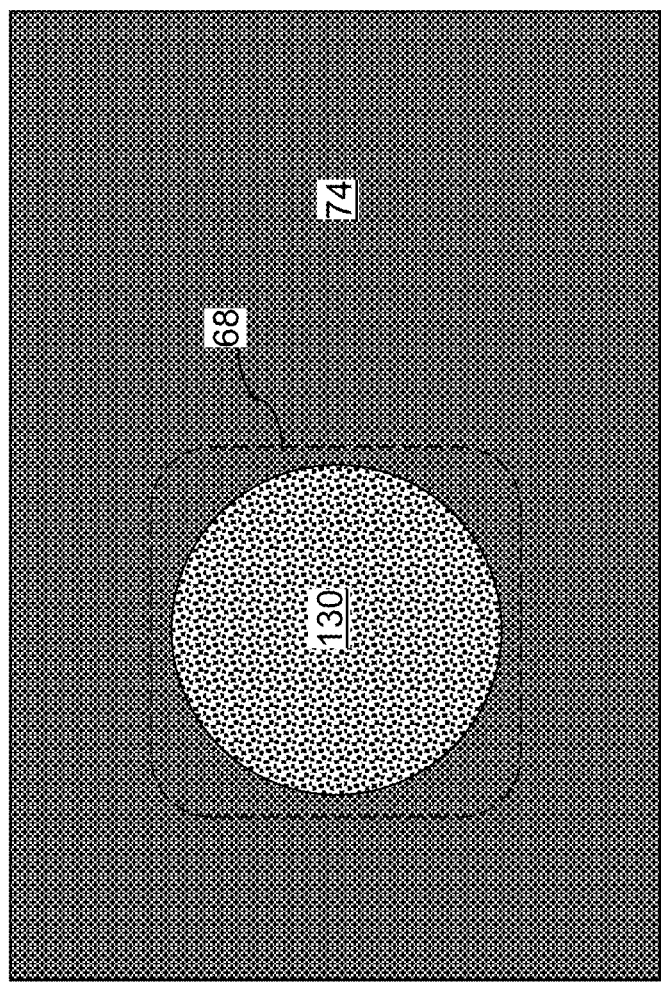
FIG. 2L is a top-down view of the portion of the first configuration of the exemplary structure that is illustrated in FIG. 2K.
Figure 3:
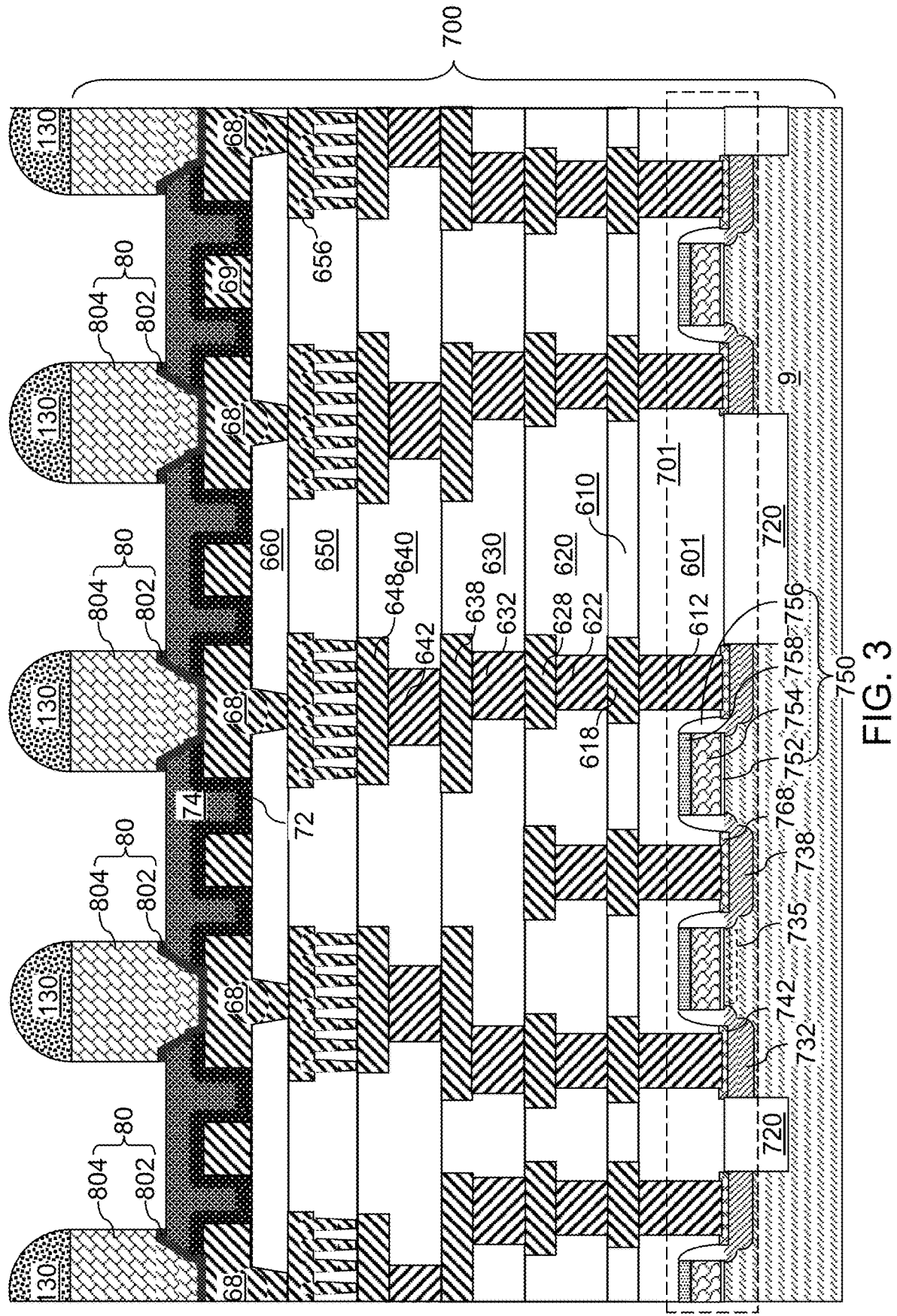
FIG. 3 is vertical cross-sectional view of a region of the first configuration of the exemplary structure of FIGS. 2K and 2L according to an embodiment of the present disclosure.

Referring to FIGS. 2K, 2L, and 3, a solder material portion 130 may be attached to the top surface of each of the metal bump structures 80. In one embodiment, each of the metal bump structures 80 may be located entirely within an area of the respective underlying one of the bonding pads 68 in a plan view along a direction that is perpendicular to a top surface of the topmost interconnect-level dielectric material layer 660.

Generally, metal bump structures 80 may be formed on the first bonding pads 68 through the dielectric passivation layer 72. Each of the first metal bump structures 80 comprises a contoured bottom surface including a bottommost surface segment BSS in contact with a top surface of a respective one of the bonding pads 68, a first tapered surface segment TSS1 in contact with a tapered sidewall of a respective opening through the dielectric passivation layer 72, and a first annular surface segment ASS1 that overlies the dielectric passivation layer 72 and having an inner periphery that is laterally offset inward from an outer periphery by a first lateral offset distance ENA that is at least 8% of a width, i.e., the pad width PW, of a respective underlying one of the first bonding pads 68. In one embodiment, the diameter of the inner periphery of the first annular surface segment ASS1 may be the same as the top pad opening width TPOW. In one embodiment, the outer periphery of the first annular surface segment ASS1 may be the same as the bottom periphery of a cylindrical sidewall of the metal bump structure 80.

In one embodiment, a capping dielectric material layer 74 may overlie the dielectric passivation layer 72, and each of the metal bump structures 80 comprises an additional tapered surface segment, i.e., a second tapered sidewall segment TSS2, in contact with a tapered sidewall of a respective opening through the capping dielectric material layer 74.

In some embodiments, the capping dielectric material layer 74 comprises a horizontal top surface that extends over areas that are not covered by the metal bump structures, and a cylindrical surfaces segment of the capping dielectric material layer 74 extends between a bottom periphery of each of the metal bump structures 80 and a respective periphery of the horizontal top surface of the capping dielectric material layer 74.

In one embodiment, the first annular surface segment ASS1 of each of the metal bump structures 80 contacts a respective annular surface segment of the capping dielectric material layer 74, and each of the metal bump structures 80 comprises an additional annular surface segment (i.e., a second annular surface segment ASS2) in contact with a respective annular surface segment of a top surface of a capping segment 723 of the dielectric passivation layer 72 that overlies a respective one of the bonding pads 68.

Figure 4:
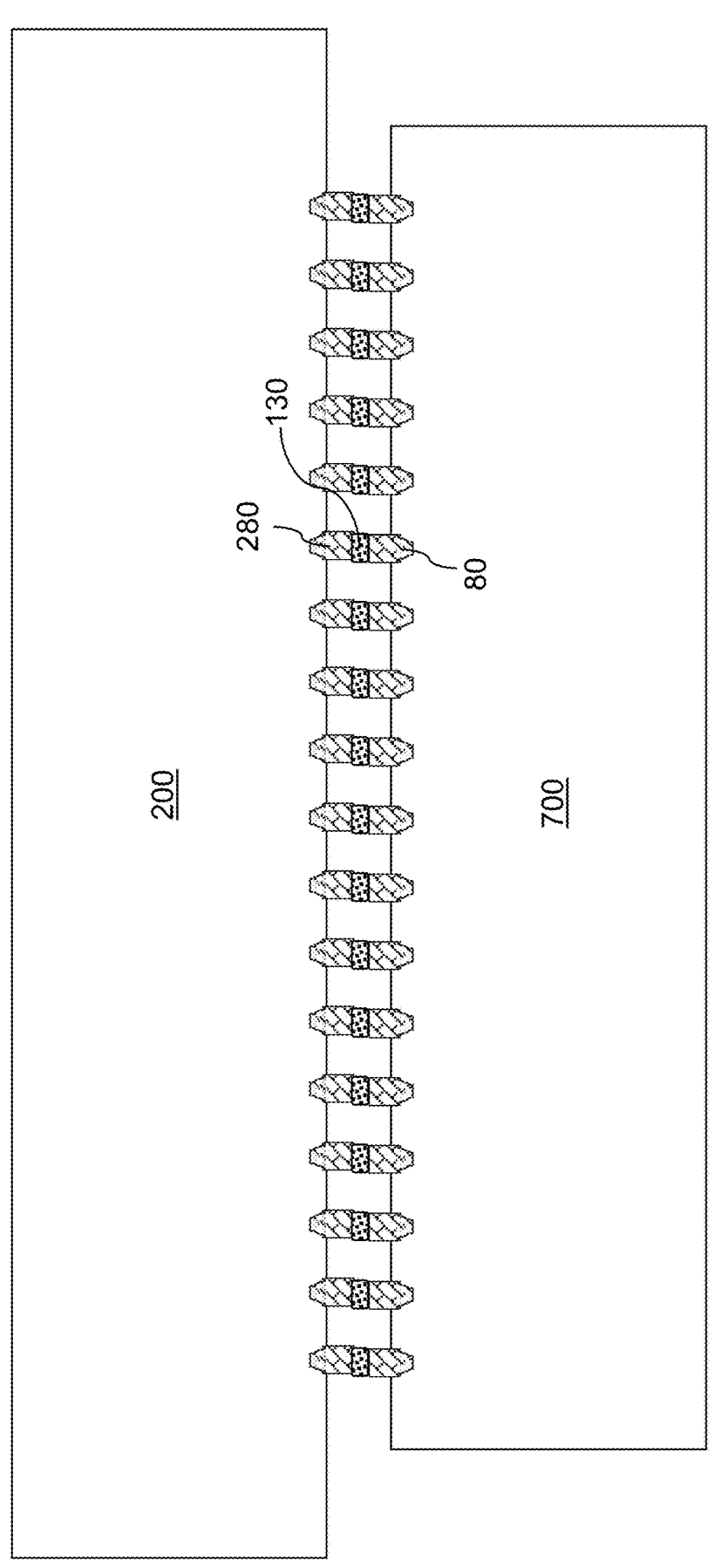
FIG. 4 is a vertical cross-sectional view of the first configuration of the exemplary structure after attaching a semiconductor die to an interconnect-containing structure according to an embodiment of the present disclosure.

Referring to FIG. 4, a first semiconductor die 700 is illustrated, which includes the first configuration of the exemplary structure illustrated in FIG. 3. An interconnect-containing structure 200 is provided, which has an array of second metal bump structures 280 on a mating surface thereof. The array of second metal bump structures 280 on the interconnect-containing structure 200 may have a mirror image pattern of the array of first metal bump structures 80 on the first semiconductor die 700.

Generally, the interconnect-containing structure 200 may comprise any structure that includes metal interconnect structures embedded within dielectric material layers. For example, the interconnect-containing structure 200 may comprise a second semiconductor die, an interposer, or a packaging substrate. The metal interconnect structures may comprise conventional metal interconnect structures formed in silicon oxide-based dielectric material layers as used in back-end-of-line (BEOL) semiconductor processing steps, or redistribution structures embedded within polymer layers. The first metal bump structures 80 of the first semiconductor die 700 may be bonded to the second metal bump structures 280 of the interconnect-containing structure 200 through the solder material portions 130.

Figure 5A:
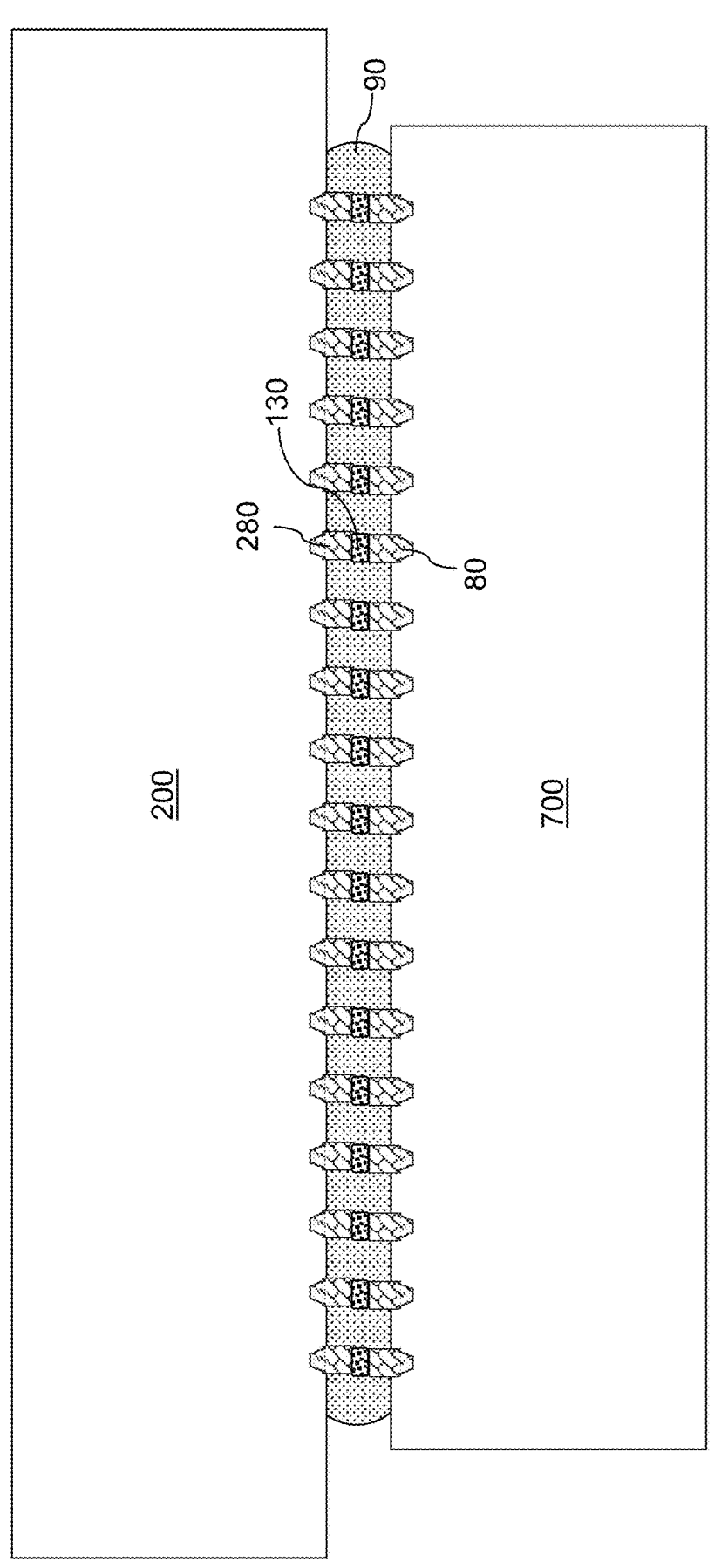
FIG. 5A is a vertical cross-sectional view of the first configuration of the exemplary structure after forming an underfill material portion according to an embodiment of the present disclosure.
Figure 5B:
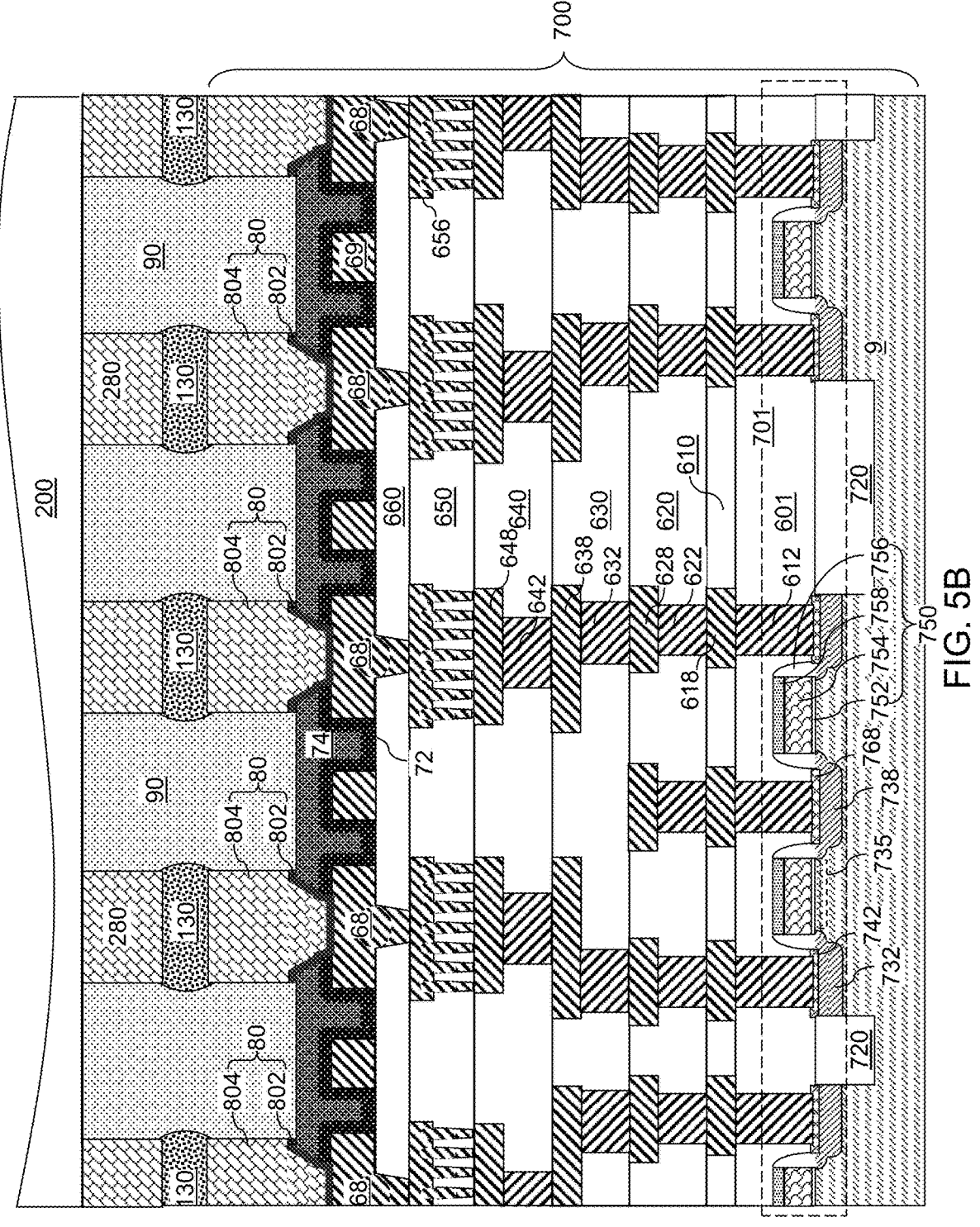
FIG. 5B is a vertical cross-sectional view of a region of the first configuration of the exemplary structure of FIG. 5A.

Referring to FIGS. 5A and 5B, an underfill material portion 90 may be applied into the gap between the first semiconductor die 700 and the interconnect-containing structure 200. The underfill material portion 90 may comprise any dielectric underfill material known in the art. The underfill material portion 90 may contact the solder material portions 130, the first metal bump structures 80 of the first semiconductor die 700, and the second metal bump structures 280 of the interconnect-containing structure 200. In one embodiment, the underfill material portion 90 may contact the horizontal top surface and vertical sidewalls (such as cylindrical surface segments) of the capping dielectric material layer 74.

In one embodiment, the first configuration of the exemplary structure may comprise first metal interconnect structures located within first interconnect-level dielectric material layers (610, 620, 630, 640, 650, 660); first bonding pads 68 located on a topmost first interconnect-level dielectric material layer 660 and electrically connected to a respective one of the first metal interconnect structures; a dielectric passivation layer 72 located on the topmost first interconnect-level dielectric material layer 660 and the first bonding pads 68; and first metal bump structures 80 extending through the dielectric passivation layer 72 and located on the first bonding pads 68. Each of the first metal bump structures 80 comprises a contoured bottom surface including a bottommost surface segment in contact with a top surface of a respective one of the bonding pads 68, and an annular surface segment that overlies, and is vertically spaced from, the dielectric passivation layer 72 and having an inner periphery that is laterally offset inward from an outer periphery by a lateral offset distance that is at least 8% of a width of a respective underlying one of the first bonding pads 68.

FIGS. 6A-6E are sequential vertical cross-sectional view of a portion of a second configuration of the exemplary structure during formation of bonding pads, a dielectric passivation layer, metal bump structures, and solder material portions according to an embodiment of the present disclosure.

Figure 6A:
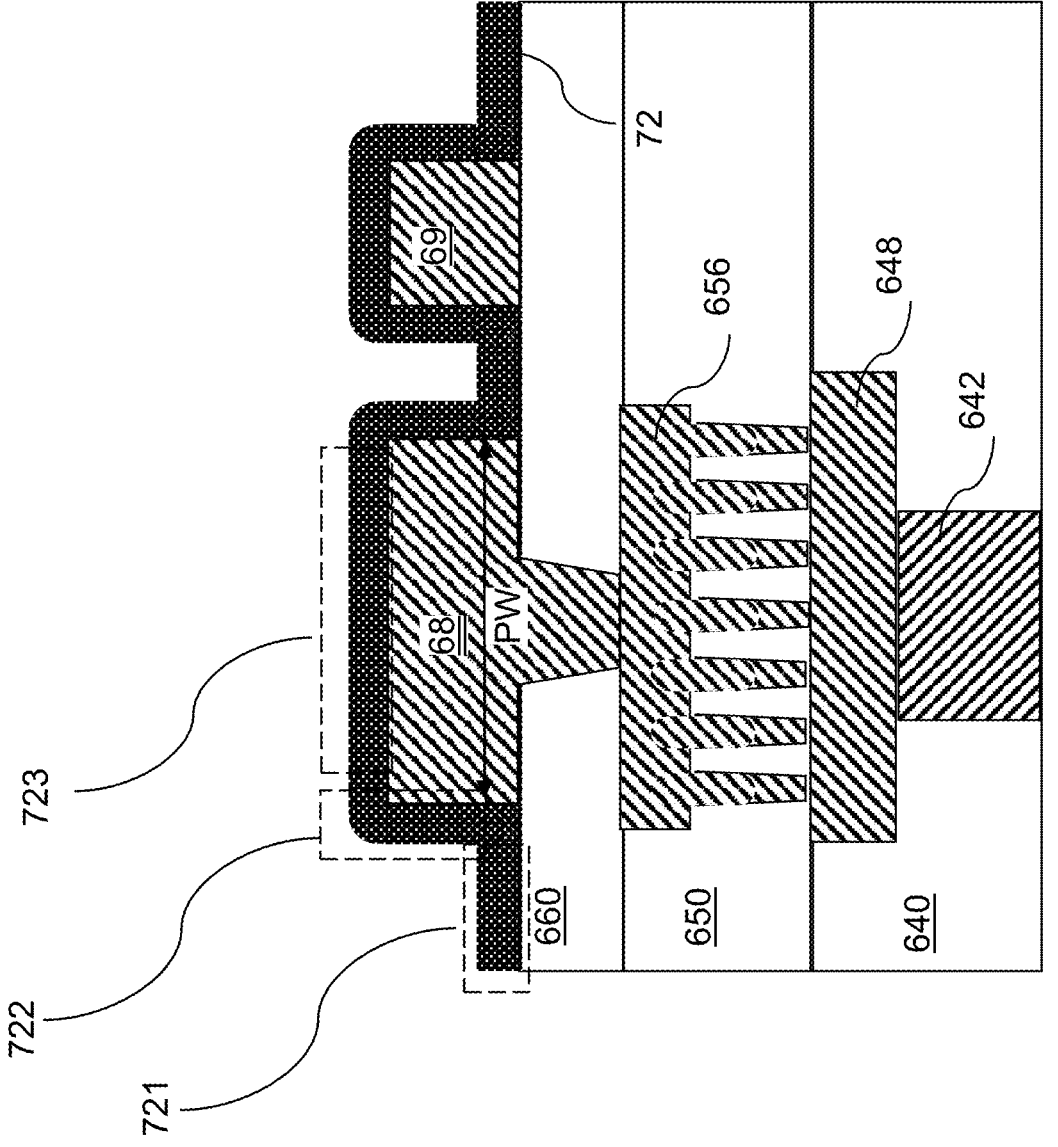
FIGS. 6A-6E are sequential vertical cross-sectional view of a portion of a second configuration of the exemplary structure during formation of bonding pads, a dielectric passivation layer, metal bump structures, and solder material portions according to an embodiment of the present disclosure.

Referring to FIG. 6A, the second configuration of the exemplary structure may be the same as the first configuration of the exemplary structure illustrated in FIG. 2C.

Figure 6B:
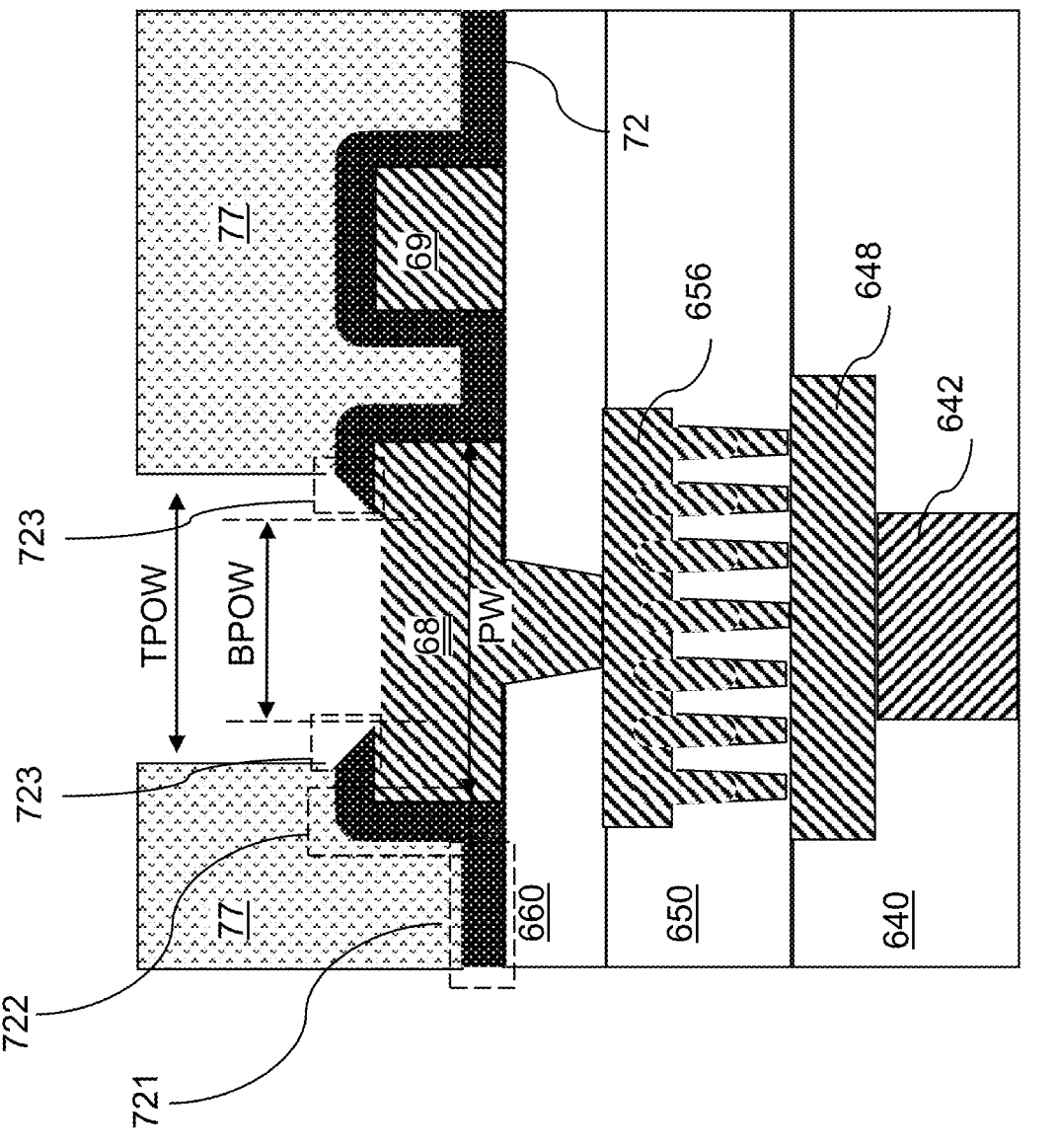

Referring to FIG. 6B, a photoresist layer 77 may be applied over the dielectric passivation layer 72, and may be lithographically patterned to form openings therein. In one embodiment, the bonding pads 68 may be formed as a two-dimensional periodic array of bonding pads 68 such as a rectangular periodic array or a hexagonal periodic array. In this case, the openings in the photoresist layer 77 may have the same two-dimensional periodicity as the underlying two-dimensional array of bonding pads 68. In one embodiment, the shape of each opening through the photoresist layer 77 may be circular, and may have a diameter that is less than the pad width PW of the bonding pads 68. In one embodiment, the area of each opening through the photoresist layer 77 may be located entirely within the area of an underlying bonding pad 68 in a plan view (such as a top-down view). In one embodiment, the entirety of the periphery of each opening through the photoresist layer 77 may be laterally offset inward from the sidewalls of the underlying bonding pad 68. In one embodiment, the ratio of the diameter of an opening in the photoresist layer 77 to the pad width PW of an underlying bonding pad 68 to may be in a range from 0.5 to 0.80, although lesser and greater ratios may also be used.

An anisotropic etch process may be performed to transfer the pattern of the openings in the photoresist layer 77 through the underlying portions of the dielectric passivation layer 72. Openings having tapered surfaces are formed through the dielectric passivation layer 72. The taper angle (as measured from a vertical direction) of the tapered sidewalls of the dielectric passivation layer 72 may be in a range from 35 degrees to 80 degrees, such as from 45 degrees to 70 degrees, although lesser and greater taper angles may also be used.

A planar top surface portion of each bonding pad 68 may be physically exposed after the anisotropic etch process. In one embodiment, each physically exposed planar top surface portion of the bonding pads 68 may have a circular shape with a diameter, which is herein referred to as a bottom pad opening width BPOW. The ratio of the bottom pad opening width BPOW to the pad width PW may be in a range from 0.3 to 0.7, such as from 0.35 to 0.65, although lesser and grater ratios may also be used. The top periphery of a tapered surface of each opening through the dielectric passivation layer 72 may have a circular shape having a diameter, which is herein referred to as a top pad opening width TPOW. The ratio of the top pad opening width TPOW to the bottom pad opening width TPOW may be in a range from 1.13 to 1.30, such as from 1.16 to 1.24, although lesser and greater ratios may also be used. The photoresist layer 77 may be removed, for example, by ashing.

Figure 6C:
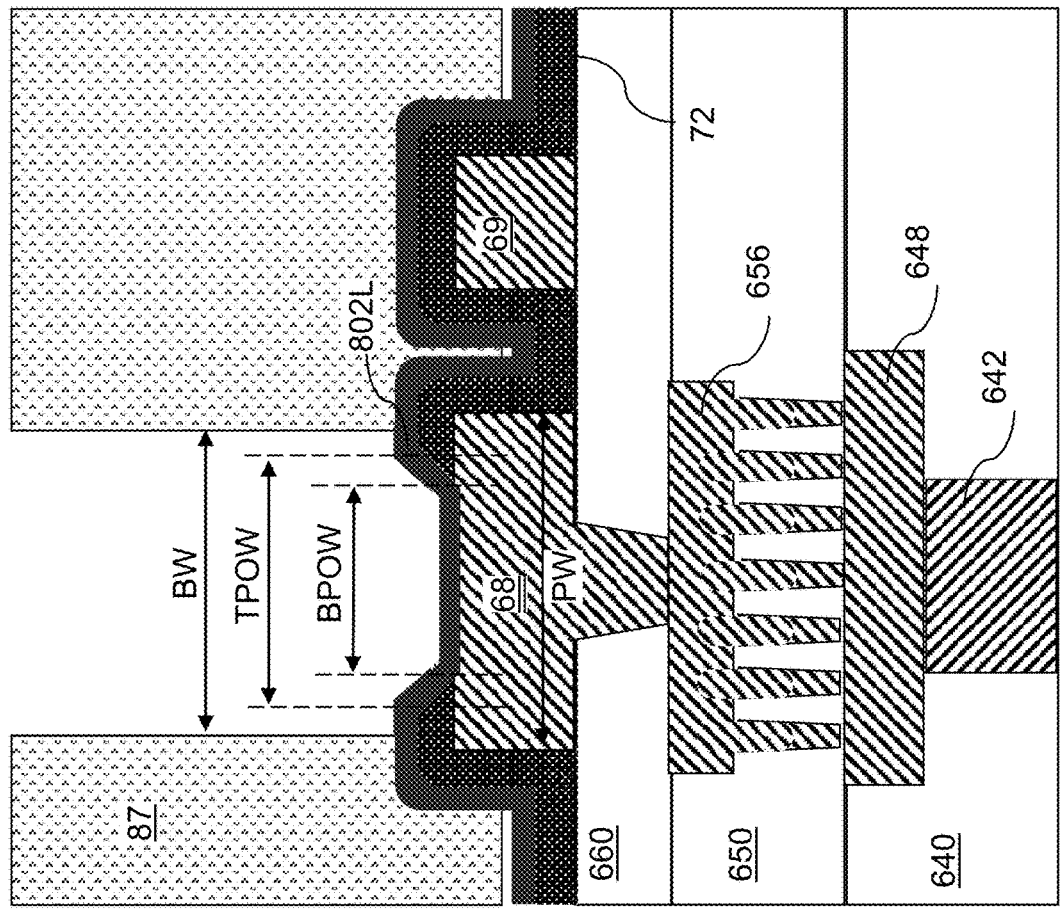

Referring to FIG. 6C, the processing steps of FIGS. 2F and 2G may be performed to form a continuous metallic seed layer 802L and a copper layer 804L. The thickness and the material composition of each of the continuous metallic seed layer 802L and the copper layer 804L may be the same as in the first configuration of the exemplary structure.

Figure 6D:
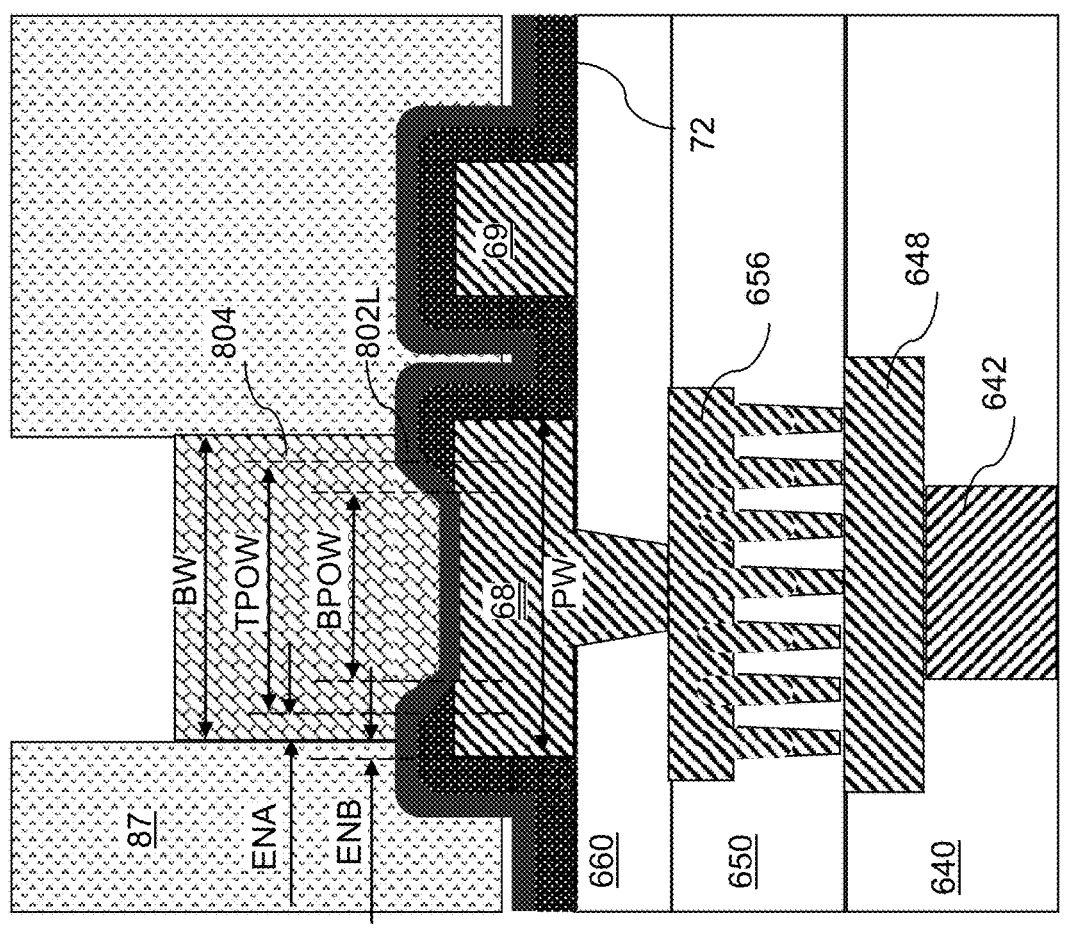

Referring to FIG. 6D, the processing steps of FIG. 2H may be performed to pattern the copper layer 804L into copper pillar structures 804. Each copper pillar structure 804 may have a diameter of the bump width BW. The ratio of the pad width PW to the bump width BW may be in a range from 1.01 to 1.60, although lesser and greater ratios may also be used. The copper pillar structures 804 may have the same two-dimensional periodicity as the bonding pads 68. The ratio of the pad width PW to the periodicity of the two-dimensional array of bonding pads 68 in any direction of periodicity may be in a range from 0.20 to 0.50, although lesser and greater ratios may also be used.

The lateral offset distance between the sidewall of a copper pillar structure 804 and a vertical plane including a most proximal portion of a top periphery of a tapered sidewall of an underlying opening through the dielectric passivation layer 72 is herein referred to as a first lateral offset distance ENA. In one embodiment, the ratio of the first lateral offset distance ENA to the pad width PW is greater than 0.08, and may be in a range from 0.08 to 0.20, such as from 0.11 to 0.16. According to an aspect of the present disclosure, selection of the ratio of the first lateral offset distance ENA to the pad width PW within the range from 0.08 to 0.20 enhances adhesion of the metal bump structures to be formed to the dielectric passivation layer 72.

The lateral offset distance between the sidewall of a copper pillar structure 804 and a vertical plane including a most proximal sidewall of an underlying bonding pad 68 is herein referred to as a second lateral offset distance ENB. In one embodiment, the ratio of the second lateral offset distance ENB to the pad width PW is greater than 0.07, and may be in a range from 0.07 to 0.18, such as from 0.10 to 0.15. According to an aspect of the present disclosure, selection of the ratio of the second lateral offset distance ENB to the pad width PW within the range from 0.07 to 0.18 enhances adhesion of the metal bump structures to be formed to the dielectric passivation layer 72 and the capping dielectric material layer 74.

Figure 6E:
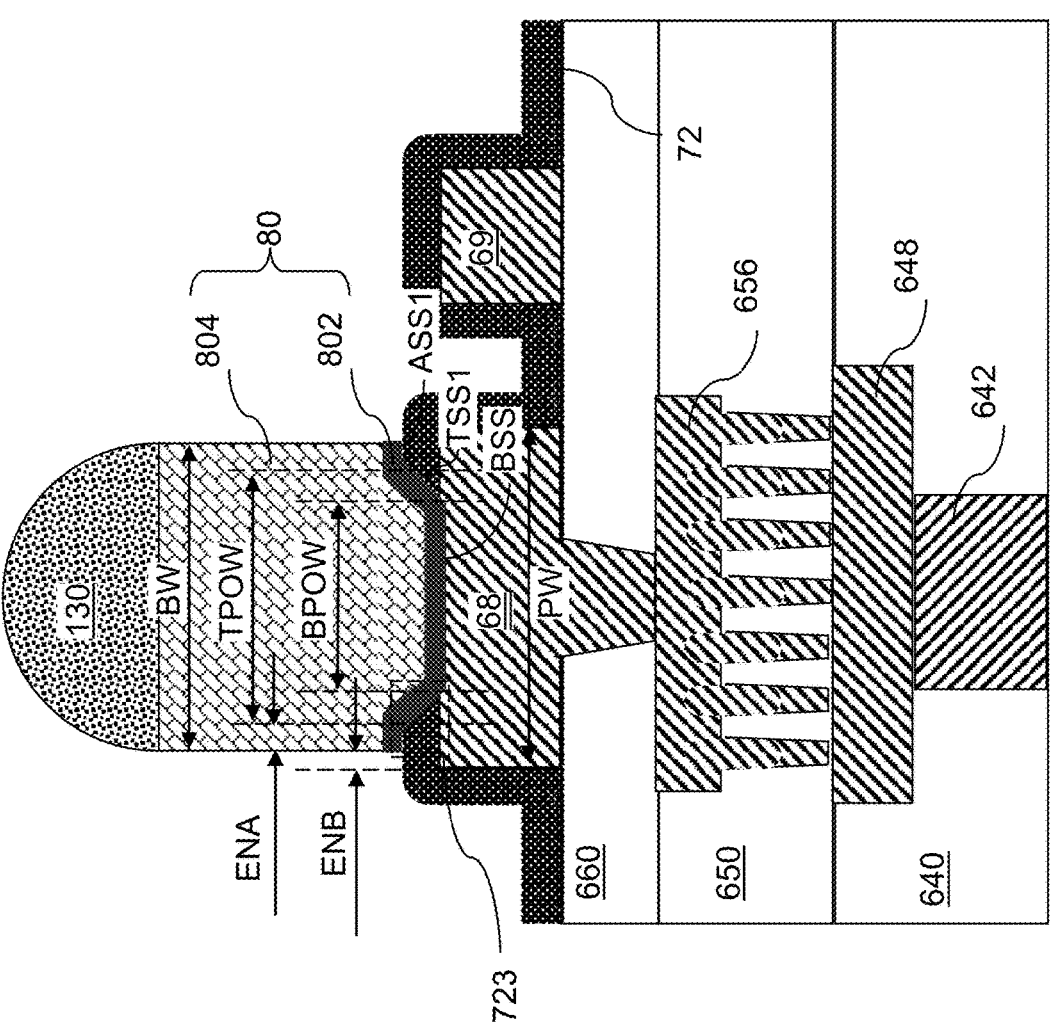

Referring to FIG. 6E, the processing steps of FIGS. 2J, 2K, 2L, and 3 may be performed to form metal bump structures 80. In one embodiment, each of the metal bump structures 80 may be located entirely within an area of the respective underlying one of the bonding pads 68 in a plan view along a direction that is perpendicular to a top surface of the topmost interconnect-level dielectric material layer 660.

Generally, metal bump structures 80 may be formed on the first bonding pads 68 through the dielectric passivation layer 72, Each of the first metal bump structures 80 comprises a contoured bottom surface including a bottommost surface segment BSS in contact with a top surface of a respective one of the bonding pads 68, a first tapered surface segment TSS1 in contact with a tapered sidewall of a respective opening through the dielectric passivation layer 72, and a first annular surface segment ASS1 that overlies the dielectric passivation layer 72 and having an inner periphery that is laterally offset inward from an outer periphery by a first lateral offset distance ENA that is at least 8% of a width, i.e., the pad width PW, of a respective underlying one of the first bonding pads 68. In one embodiment, the diameter of the inner periphery of the first annular surface segment ASS1 may be the same as the top pad opening width TPOW. In one embodiment, the outer periphery of the first annular surface segment ASS1 may be the same as the bottom periphery of a cylindrical sidewall of the metal bump structure 80. In one embodiment, the first annular surface segment ASS1 of each of the metal bump structures 80 contacts a respective annular surface segment of the dielectric passivation layer 72.

Figure 7:
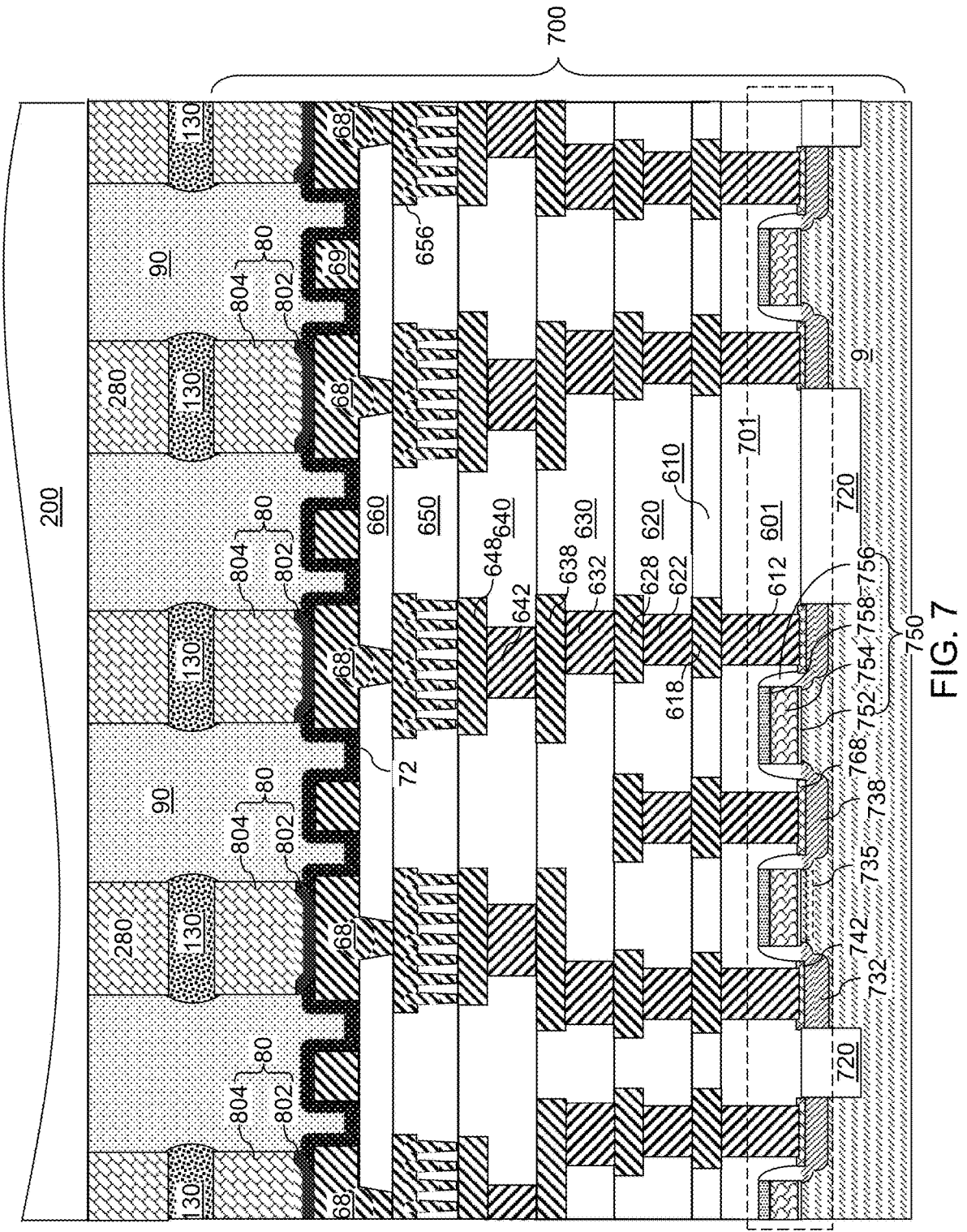
FIG. 7 is a vertical cross-sectional view of a region of the second configuration of the exemplary structure after bonding the semiconductor die to an interconnect-containing structure according to an embodiment of the present disclosure.

Referring to FIG. 7, the processing steps of FIGS. 4, 5A, and 5B may be performed to form a bonded structure including a first semiconductor die 700 and an interconnect-containing structure 200. Specifically, an underfill material portion 90 may be applied into the gap between the first semiconductor die 700 and the interconnect-containing structure 200. The underfill material portion 90 may comprise any dielectric underfill material known in the art. The underfill material portion 90 may contact the solder material portions 130, the first metal bump structures 80 of the first semiconductor die 700, and the second metal bump structures 280 of the interconnect-containing structure 200. In one embodiment, the underfill material portion 90 may contact the horizontal top surface of the dielectric passivation layer 72.

In one embodiment, the second configuration of the exemplary structure may comprise first metal interconnect structures located within first interconnect-level dielectric material layers (610, 620, 630, 640, 650, 660); first bonding pads 68 located on a topmost first interconnect-level dielectric material layer 660 and electrically connected to a respective one of the first metal interconnect structures; a dielectric passivation layer 72 located on the topmost first interconnect-level dielectric material layer 660 and the first bonding pads 68; and first metal bump structures 80 extending through the dielectric passivation layer 72 and located on the first bonding pads 68. Each of the first metal bump structures 80 comprises a contoured bottom surface including a bottommost surface segment in contact with a top surface of a respective one of the bonding pads 68, and an annular surface segment that overlies, and directly contacts, the dielectric passivation layer 72 and having an inner periphery that is laterally offset inward from an outer periphery by a lateral offset distance that is at least 8% of a width of a respective underlying one of the first bonding pads 68.

FIGS. 8A-8I are sequential vertical cross-sectional view of a portion of a third configuration of the exemplary structure during formation of bonding pads, a dielectric passivation layer, a capping dielectric material layer, metal bump structures, and solder material portions according to an embodiment of the present disclosure.

Figure 8A:
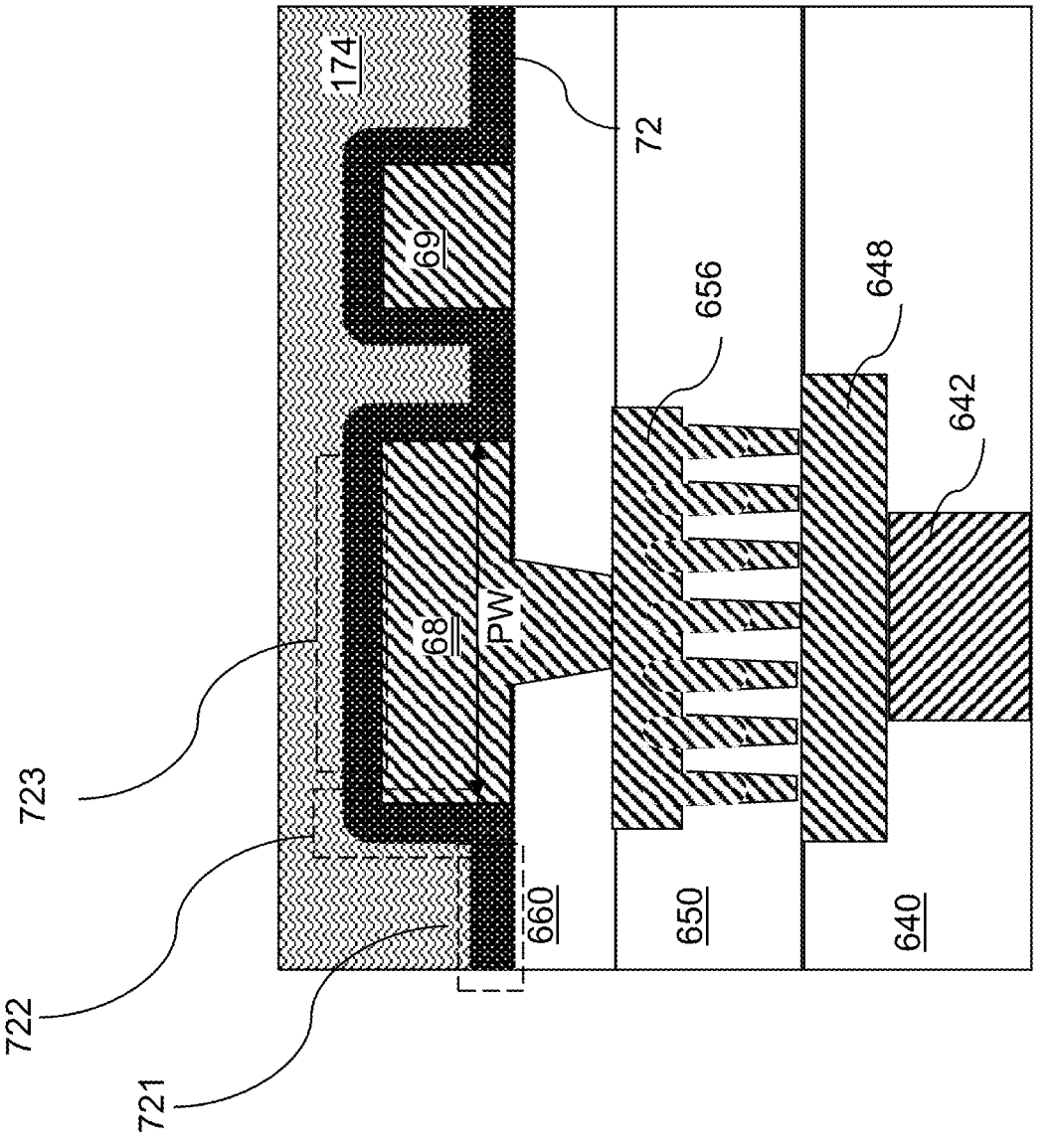
FIGS. 8A-8I are sequential vertical cross-sectional view of a portion of a third configuration of the exemplary structure during formation of bonding pads, a dielectric passivation layer, a capping dielectric material layer, metal bump structures, and solder material portions according to an embodiment of the present disclosure.

Referring to FIG. 8A, the third configuration of the exemplary structure may be derived from the first configuration of the exemplary structure illustrated in FIG. 2C by forming a capping dielectric material layer 174 over the dielectric passivation layer 72. According to an aspect of the present disclosure, the capping dielectric material layer 174 includes a polymer material such as polyimide. In one embodiment, the polymer material of the capping dielectric material layer 174 may be deposited by spin coating to provide a planar horizontal top surface. The vertical distance between the topmost surfaces (such as the top surfaces of the capping segments 723) of the dielectric passivation layer 72 and the top surface of the capping dielectric material layer 174 may be in a range from 100 nm to 2 microns, such as from 200 nm to 1.5 micron and/or from 300 nm to 1 micron, although lesser and greater vertical distances may also be used. In one embodiment, the ratio of the vertical distance between the topmost surfaces of the dielectric passivation layer 72 and the top surface of the capping dielectric material layer 174 to the thickness of the dielectric passivation layer 72 may be greater than 1.0, and may be in a range from 1.0 to 3.0.

Figure 8B:
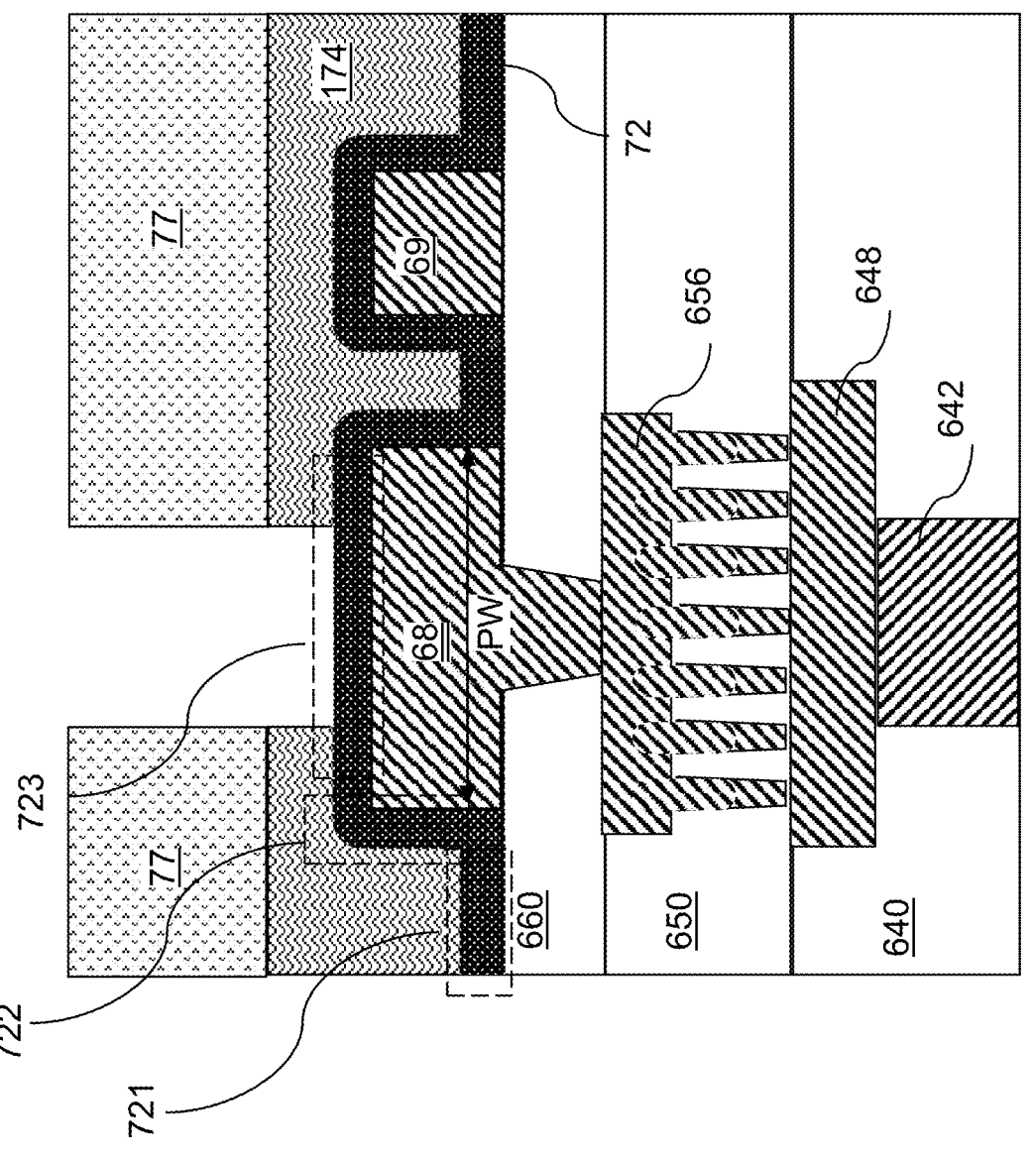

Referring to FIG. 8B, a photoresist layer 77 may be applied over the capping dielectric material layer 174, and may be lithographically patterned to form openings therein. In one embodiment, the bonding pads 68 may be formed as a two-dimensional periodic array of bonding pads 68 such as a rectangular periodic array or a hexagonal periodic array. In this case, the openings in the photoresist layer 77 may have the same two-dimensional periodicity as the underlying two-dimensional array of bonding pads 68. In one embodiment, the shape of each opening through the photoresist layer 77 may be circular, and may have a diameter that is less than the pad width PW of the bonding pads 68. In one embodiment, the area of each opening through the photoresist layer 77 may be located entirety within the area of an underlying bonding pad 68 in a plan view (such as a top-down view). In one embodiment, the entirety of the periphery of each opening through the photoresist layer 77 may be laterally offset inward from the sidewalls of the underlying bonding pad 68. In one embodiment, the ratio of the diameter of an opening in the photoresist layer 77 to the pad width PW of an underlying bonding pad 68 to may be in a range from 0.5 to 0.80, although lesser and greater ratios may also be used.

An anisotropic etch process may be performed to transfer the pattern of the openings in the photoresist layer 77 through the underlying portions of the capping dielectric material layer 174. Openings having tapered surfaces are formed through the capping dielectric material layer 174 and the dielectric passivation layer 72.

In an alternative embodiment, the capping dielectric material layer 174 may comprise a photosensitive polymer material that may be patterned by lithographic exposure and development. In this case, the capping dielectric material layer 174 may be patterned without use of the photoresist layer 77.

Figure 8C:
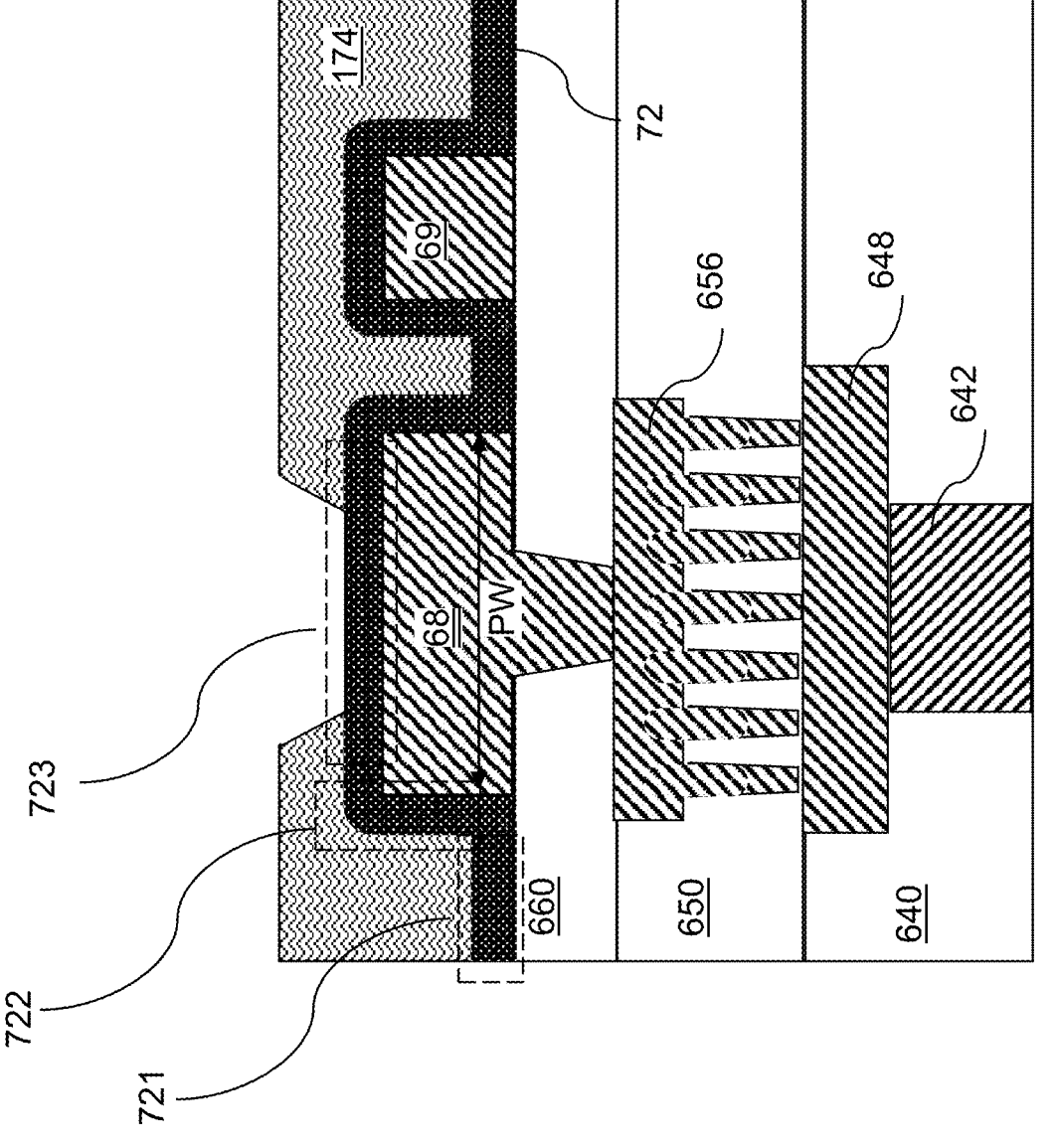

Referring to FIG. 8C, the photoresist layer 77 may be removed selective to the capping dielectric material layer 174, for example, by ashing or by dissolution in a solvent. An anneal process may be performed to cure the polymer material of the capping dielectric material layer 174. Shrinkage of the polymer material of the capping dielectric material layer 174 causes formation of tapered surfaces around openings through the capping dielectric material layer 174. The taper angle (as measured from a vertical direction) of the tapered sidewalls of the capping dielectric material layer 174 may be in a range from 30 degrees to 75 degrees, such as from 40 degrees to 65 degrees, although lesser and greater taper angles may also be used. In one embodiment, each physically exposed planar top surface portion of the dielectric passivation layer 72 may have a circular shape with a diameter.

Figure 8D:
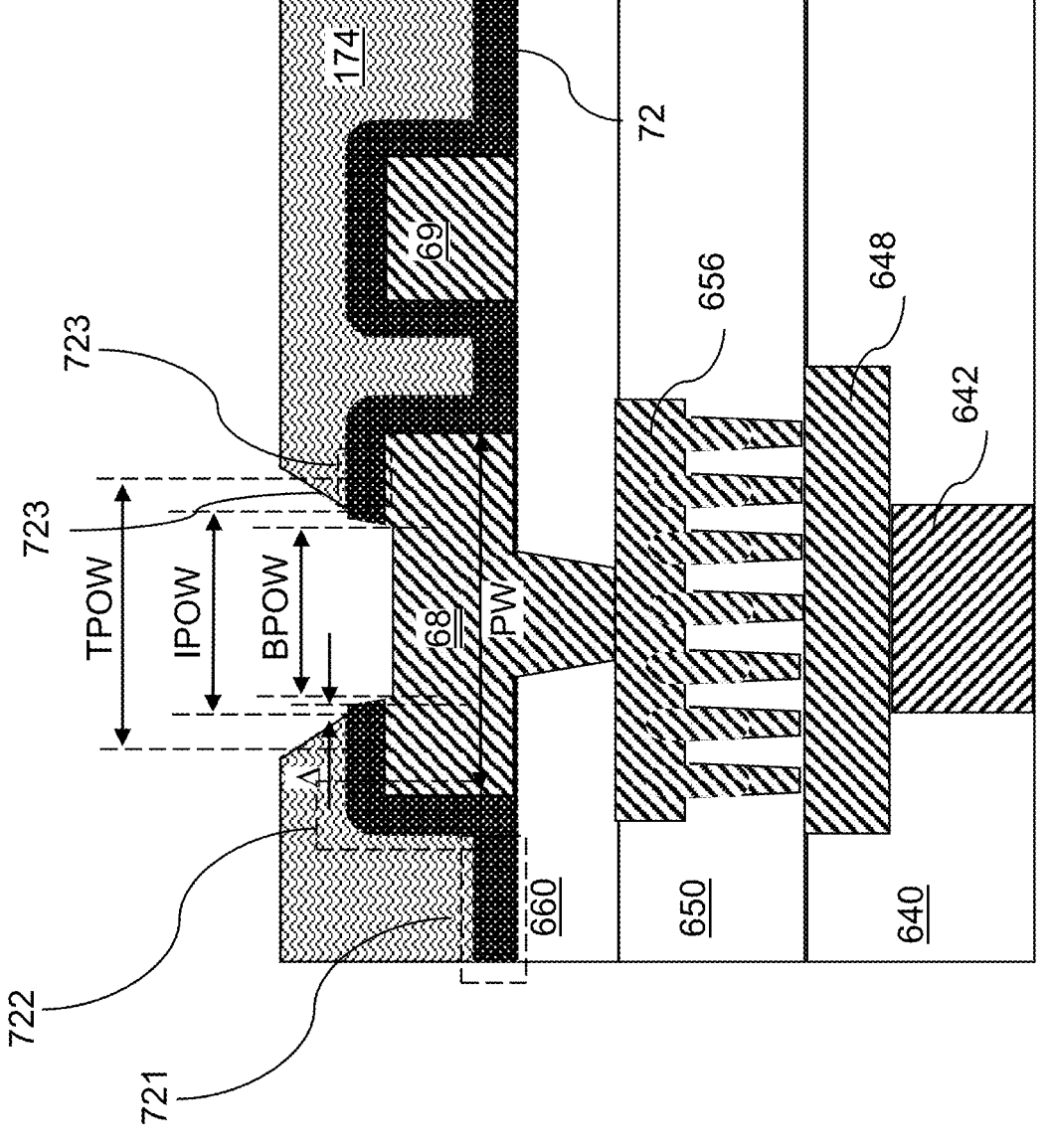

Referring to FIG. 8D, an anisotropic etch process may be performed to etch portions of the dielectric passivation layer 72 that are not masked by the capping dielectric material layer 174. A planar top surface portion of each bonding pad 68 may be physically exposed after the anisotropic etch process. In one embodiment, each physically exposed planar top surface portion of the bonding pads 68 may have a circular shape with a diameter, which is herein referred to as a bottom pad opening width BPOW. The ratio of the bottom pad opening width BPOW to the pad width PW may be in a range from 0.3 to 0.7, such as from 0.35 to 0.65, although lesser and grater ratios may also be used.

A selective etch process may be optionally performed to recess physically exposed surfaces of the capping dielectric material layer 174 selective to the dielectric passivation layer 72. The recess distance of the capping dielectric material layer 174 may be in a range from 1 nm to 100 nm, such as from 3 nm to 50 nm, although lesser and greater recess distances may be used. The selective etch process may comprise an isotropic etch process or an anisotropic etch process.

A top periphery of each tapered opening through the capping dielectric material layer 174 may be circular, and may have a lateral dimension (i.e., a diameter) that is herein referred to as a top pad opening width TPOW. The ratio of the top pad opening width TPOW to the bottom pad opening width BPOW may be in a range from 1.13 to 1.30, such as from 1.16 to 1.24, although lesser and greater ratios may also be used.

Generally, the taper angle of the tapered sidewalls of the capping dielectric material layer 174 and the taper angle of the tapered sidewalls of the dielectric passivation layer 72 may be the same or different. The taper angle (as measured from a vertical direction) of the tapered sidewalls of the capping dielectric material layer 174 may be in a range from 30 degrees to 75 degrees, such as from 40 degrees to 65 degrees, although lesser and greater taper angles may also be used. The taper angle (as measured from a vertical direction) of the tapered sidewalls of the dielectric passivation layer 72 may be in a range from 35 degrees to 80 degrees, such as from 45 degrees to 70 degrees, although lesser and greater taper angles may also be used. In one embodiment, the taper angle of the tapered sidewalls of the dielectric passivation layer 72 may be greater than the taper angle of the tapered sidewalls of the capping dielectric material layer 174.

A top periphery of each tapered opening through the dielectric passivation layer 72 may be circular, and may have a lateral dimension (i.e., a diameter) that is herein referred to as an intermediate pad opening width IPOW. A lateral offset $\Delta$ may be present between a bottom periphery of a tapered opening through the capping dielectric material layer 174 and the top periphery of an underlying tapered opening through the dielectric passivation layer 72. The A lateral offset $\Delta$ may be the same as the recess distance of the selective etch process, and may be in a range from 1 nm to 100 nm, such as from 3 nm to 50 nm, although lesser and greater recess distances may be used.

Figure 8E:
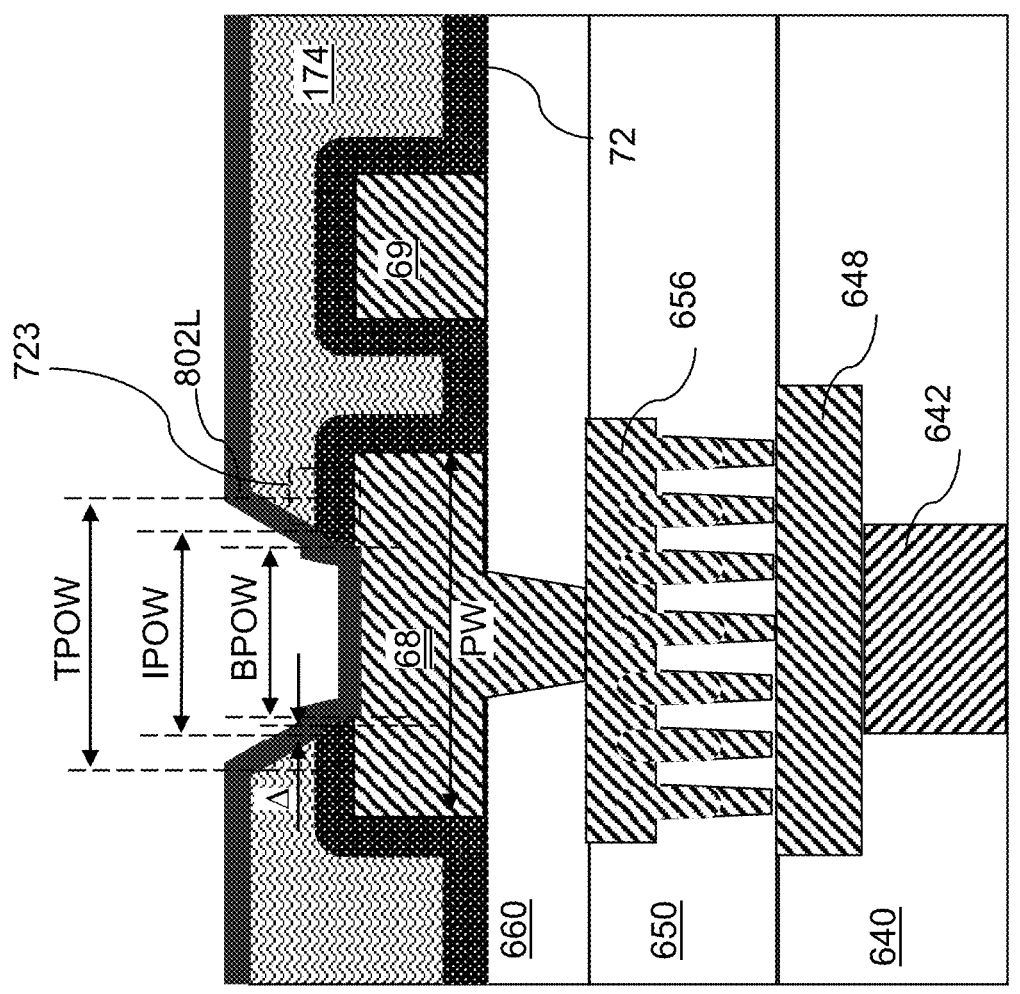

Referring to FIG. 8E, a continuous metallic seed layer 802L may be deposited over, and directly on, the physically exposed surfaces of the dielectric passivation layer 72, the capping dielectric material layer 174, and the bonding pads 68. The continuous metallic seed layer 802L includes a continuous metallic seed material such as Ti, Ta, W, TiN, TaN, or WN. In one embodiment, the continuous metallic seed layer 802L may be deposited by physical deposition process. The continuous metallic seed layer 802L may be deposited in the openings through the capping segments 723 of the dielectric passivation layer 72 and on physically exposed surfaces of the bonding pads 68. The thickness of the continuous metallic seed layer 802L may be in a range from 30 nm to 300 nm, although lesser and greater thicknesses may also be used.

Figure 8F:
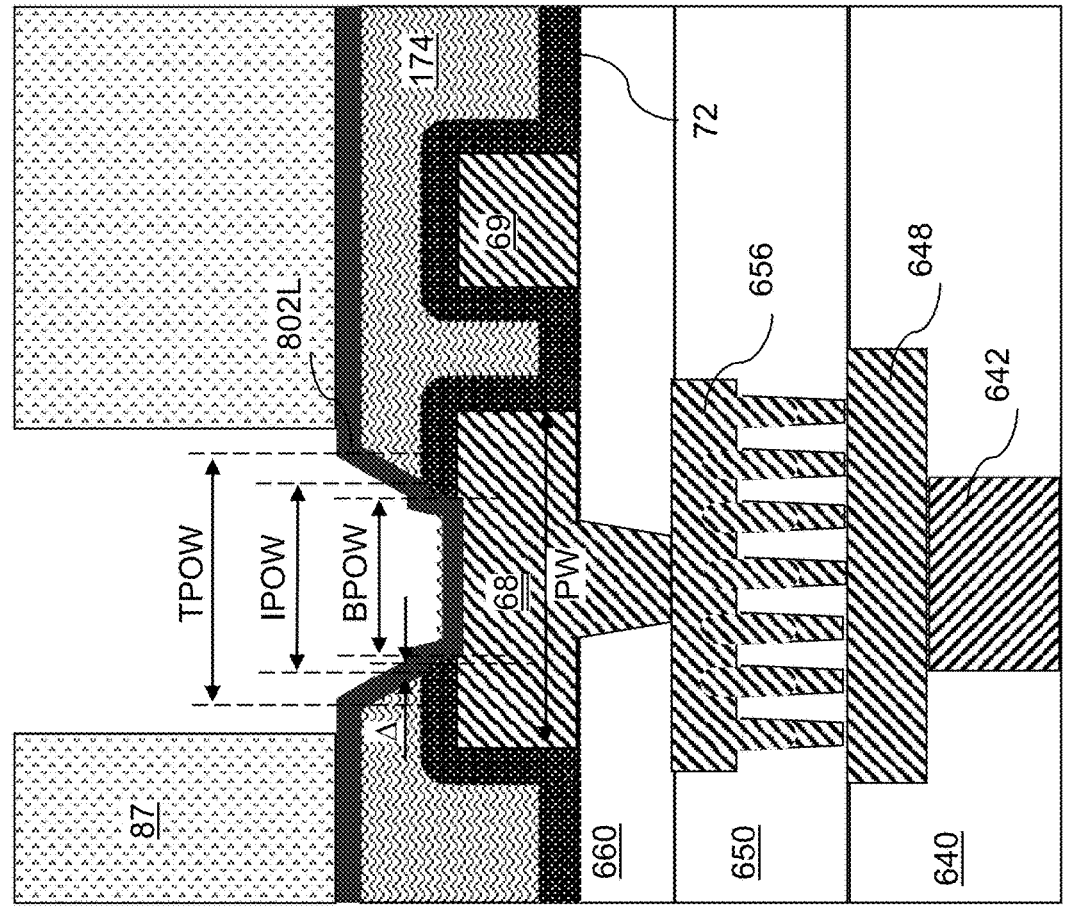

Referring to FIG. 8F, a photoresist layer 87 may be formed over the continuous metallic seed layer 802L, and may be lithographically patterned to form openings over each of the openings through the capping dielectric material layer 174. The thickness of the photoresist layer 87 may be greater than the height of the copper pillar structures to be subsequently formed. For example, the thickness of the photoresist layer 87 as measured over the top surface of the capping dielectric material layer 174 may be in a range from 2 micron to 30 microns, such as from 3 microns to 20 microns, although lesser and greater thicknesses may also be used. In one embodiment, openings in the photoresist layer 87 may have a respective shape of a circular cylindrical pillar having a diameter, which is herein referred to as a bump width BW. In one embodiment, each opening in the photoresist layer 87 may have a respective periphery that is located entirely within the area of an underlying bonding pad 68.

Figure 8G:
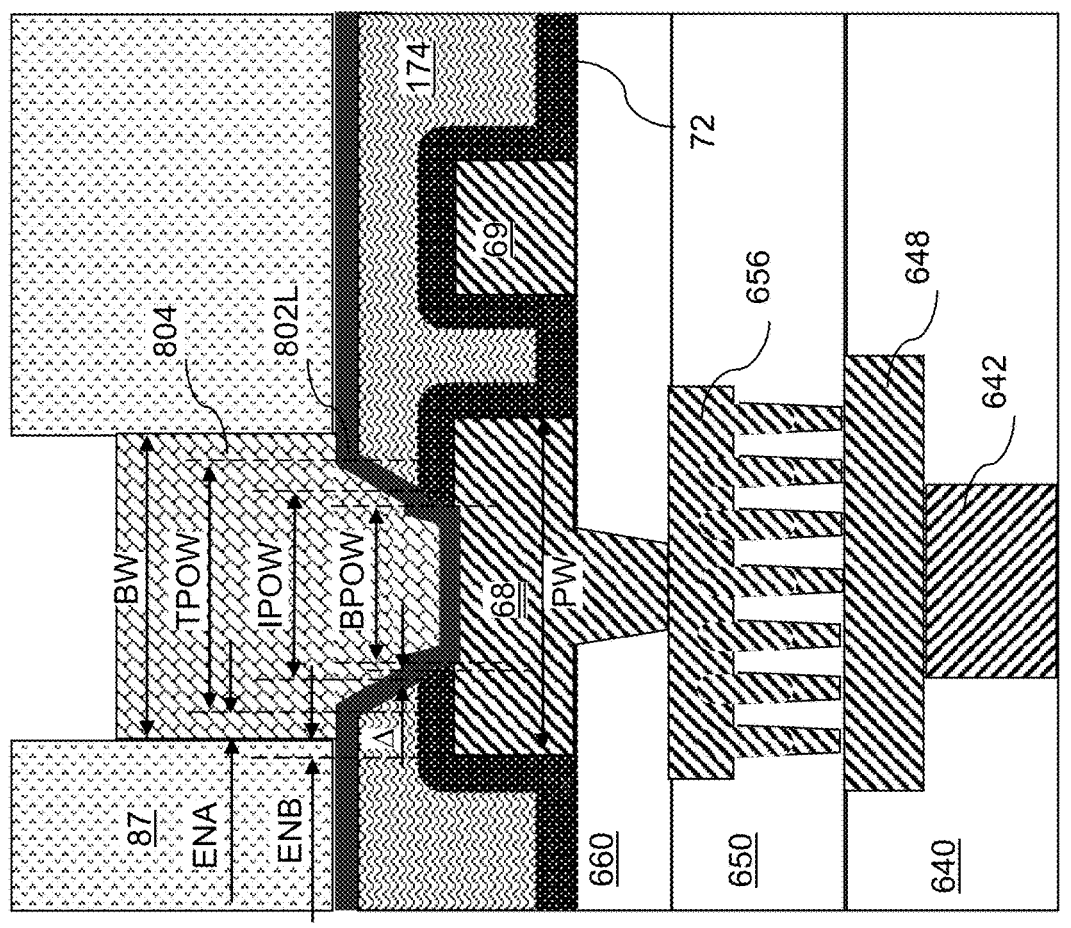

Referring to FIG. 8G, copper pillar structures 804 can be formed within the openings in the photoresist layer 87 directly on physically exposed metallic surfaces of the continuous metallic seed layer 802L, for example, by electroplating. Each electroplate material portion located within a respective opening in the photoresist layer 87 constitutes a copper pillar structure 804. Each copper pillar structure 804 may have a diameter of the bump width BW. The ratio of the pad width PW to the bump width BW may be in a range from 1.01 to 1.60, although lesser and greater ratios may also be used. The copper pillar structures 804 may have the same two-dimensional periodicity as the bonding pads 68. The ratio of the pad width PW to the periodicity of the two-dimensional array of bonding pads 68 in any direction of periodicity may be in a range from 0.20 to 0.50, although lesser and greater ratios may also be used.

The lateral offset distance between the sidewall of a copper pillar structure 804 and a vertical plane including a most proximal portion of a top periphery of a tapered sidewall of an underlying opening through the capping dielectric material layer 174 is herein referred to as a first lateral offset distance ENA. In one embodiment, the ratio of the first lateral offset distance ENA to the pad width PW is greater than 0.08, and may be in a range from 0.08 to 0.20, such as from 0.11 to 0.16. According to an aspect of the present disclosure, selection of the ratio of the first lateral offset distance ENA to the pad width PW within the range from 0.08 to 0.20 enhances adhesion of the metal bump structures to be formed to the dielectric passivation layer 72 and the capping dielectric material layer 174.

The lateral offset distance between the sidewall of a copper pillar structure 804 and a vertical plane including a most proximal sidewall of an underlying bonding pad 68 is herein referred to as a second lateral offset distance ENB. In one embodiment, the ratio of the second lateral offset distance ENB to the pad width PW is greater than 0.07, and may be in a range from 0.07 to 0.18, such as from 0.10 to 0.15. According to an aspect of the present disclosure, selection of the ratio of the second lateral offset distance ENB to the pad width PW within the range from 0.07 to 0.18 enhances adhesion of the metal bump structures to be formed to the dielectric passivation layer 72 and the capping dielectric material layer 174.

Figure 8H:
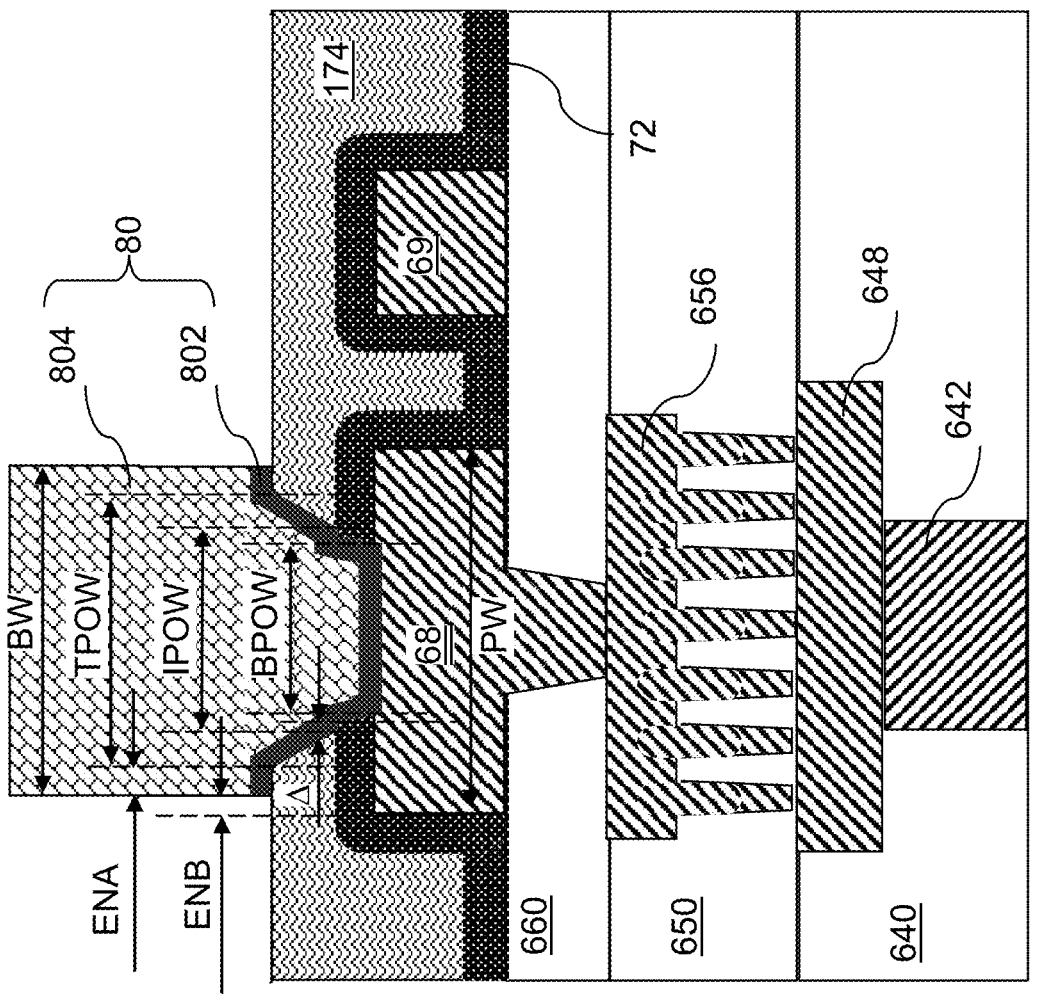

Referring to FIG. 8H, the photoresist layer 87 may be removed selective to the copper pillar structures 804 and the continuous metallic seed layer 802L, for example, by ashing. An etch process may be performed to etch physically exposed portions of the continuous metallic seed layer 802L. The etch process may comprise an anisotropic etch process or an isotropic etch process. Each patterned portion of the continuous metallic seed layer 802L comprises a metallic seed layer 802. Each contiguous combination of a metallic seed layer 802 and a copper pillar structure 804 constitutes a metal bump structure 80.

Figure 8I:
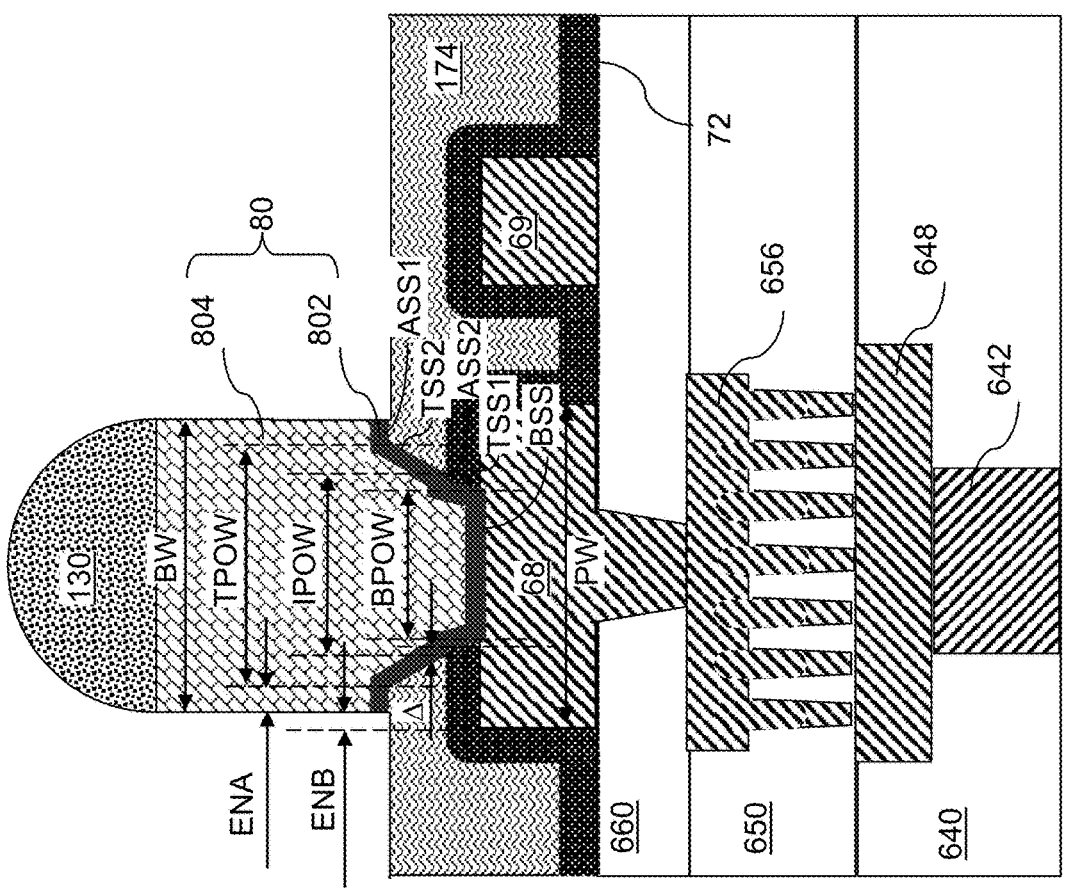

Referring to FIG. 8I, a solder material portion 130 may be attached to the top surface of each of the metal bump structures 80. In one embodiment, each of the metal bump structures 80 may be located entirely within an area of the respective underlying one of the bonding pads 68 in a plan view along a direction that is perpendicular to a top surface of the topmost interconnect-level dielectric material layer 660.

Generally, metal bump structures 80 may be formed on the first bonding pads 68 through the dielectric passivation layer 72, Each of the first metal bump structures 80 comprises a contoured bottom surface including a bottommost surface segment BSS in contact with a top surface of a respective one of the bonding pads 68, a first tapered surface segment TSS1 in contact with a tapered sidewall of a respective opening through the dielectric passivation layer 72, and a first annular surface segment ASS1 that overlies the dielectric passivation layer 72 and having an inner periphery that is laterally offset inward from an outer periphery by a first lateral offset distance ENA that is at least 8% of a width, i.e., the pad width PW, of a respective underlying one of the first bonding pads 68. In one embodiment, the diameter of the inner periphery of the first annular surface segment ASS1 may be the same as the top pad opening width TPOW. In one embodiment, the outer periphery of the first annular surface segment ASS1 may be the same as the bottom periphery of a cylindrical sidewall of the metal bump structure 80.

In one embodiment, a capping dielectric material layer 174 may overlie the dielectric passivation layer 72, and each of the metal bump structures 80 comprises an additional tapered surface segment, i.e., a second tapered sidewall segment TSS2, in contact with a tapered sidewall of a respective opening through the capping dielectric material layer 174.

In some embodiments, the capping dielectric material layer 174 comprises a horizontal top surface that extends over areas that are not covered by the metal bump structures, and a cylindrical surfaces segment of the capping dielectric material layer 174 extends between a bottom periphery of each of the metal bump structures 80 and a respective periphery of the horizontal top surface of the capping dielectric material layer 174.

In one embodiment, the first annular surface segment ASS1 of each of the metal bump structures 80 contacts a respective annular surface segment of the capping dielectric material layer 174, and each of the metal bump structures 80 comprises an additional annular surface segment (i.e., a second annular surface segment ASS2) in contact with a respective annular surface segment of a top surface of a capping segment 723 of the dielectric passivation layer 72 that overlies a respective one of the bonding pads 68.

Figure 9:
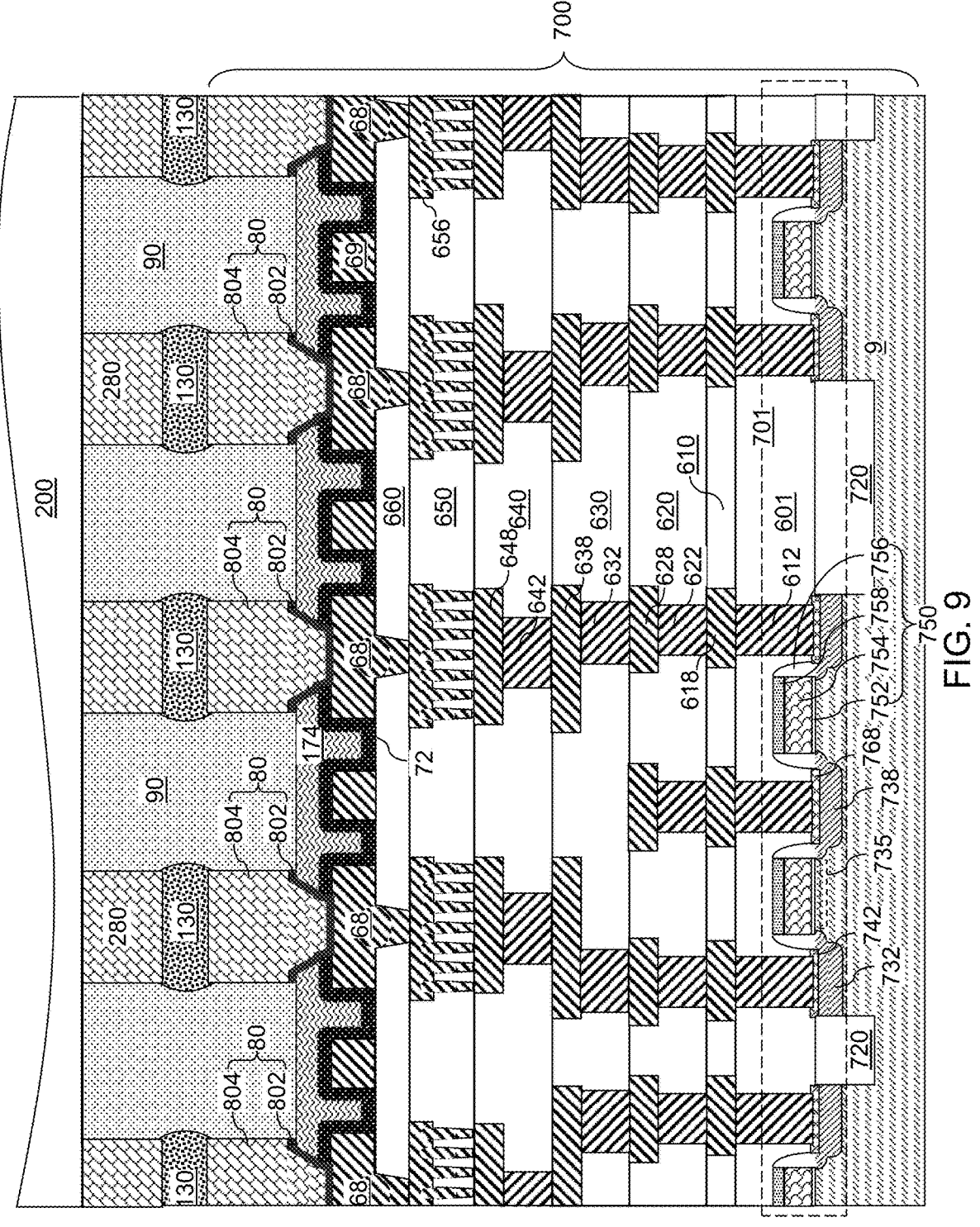
FIG. 9 is a vertical cross-sectional view of a region of the third configuration of the exemplary structure after bonding the semiconductor die to an interconnect-containing structure according to an embodiment of the present disclosure.

Referring to FIG. 9, a first semiconductor die 700 is illustrated, which includes the third configuration of the exemplary structure illustrated in FIG. 8I. An interconnect-containing structure 200 is provided, which has an array of second metal bump structures 280 on a mating surface thereof. The array of second metal bump structures 280 on the interconnect-containing structure 200 may have a mirror image pattern of the array of first metal bump structures 80 on the first semiconductor die 700.

Generally, the interconnect-containing structure 200 may comprise any structure that includes metal interconnect structures embedded within dielectric material layers. For example, the interconnect-containing structure 200 may comprise a second semiconductor die, an interposer, or a packaging substrate. The metal interconnect structures may comprise conventional metal interconnect structures formed in silicon oxide-based dielectric material layers as used in back-end-of-line (BEOL) semiconductor processing steps, or redistribution structures embedded within polymer layers. The first metal bump structures 80 of the first semiconductor die 700 may be bonded to the second metal bump structures 280 of the interconnect-containing structure 200 through the solder material portions 130.

An underfill material portion 90 may be applied into the gap between the first semiconductor die 700 and the interconnect-containing structure 200. The underfill material portion 90 may comprise any dielectric underfill material known in the art. The underfill material portion 90 may contact the solder material portions 130, the first metal bump structures 80 of the first semiconductor die 700, and the second metal bump structures 280 of the interconnect-containing structure 200. In one embodiment, the underfill material portion 90 may contact the horizontal top surface and vertical sidewalls (such as cylindrical surface segments) of the capping dielectric material layer 174.

In one embodiment, the third configuration of the exemplary structure may comprise first metal interconnect structures located within first interconnect-level dielectric material layers (610, 620, 630, 640, 650, 660); first bonding pads 68 located on a topmost first interconnect-level dielectric material layer 660 and electrically connected to a respective one of the first metal interconnect structures; a dielectric passivation layer 72 located on the topmost first interconnect-level dielectric material layer 660 and the first bonding pads 68; and first metal bump structures 80 extending through the dielectric passivation layer 72 and located on the first bonding pads 68. Each of the first metal bump structures

80 comprises a contoured bottom surface including a bottommost surface segment in contact with a top surface of a respective one of the bonding pads 68, and an annular surface segment that overlies, and is vertically spaced from, the dielectric passivation layer 72 and having an inner periphery that is laterally offset inward from an outer periphery by a lateral offset distance that is at least 8% of a width of a respective underlying one of the first bonding pads 68. In one embodiment, the capping dielectric material comprises a polymer material.

Referring to FIG. 10, a flowchart illustrates steps for forming a semiconductor structure according to an embodiment of the present disclosure.

Referring to step 1010 and FIGS. 1 and 2A, first metal interconnect structures are formed within first interconnect-level dielectric material layers (610, 620, 630, 640, 650, 660) of a first semiconductor die.

Referring to step 1020 and FIGS. 2B, 6A, and 8A, first bonding pads 68 are formed on a topmost first interconnect-level dielectric material layer 660. The first bonding pads 68 are electrically connected to a respective one of the first metal interconnect structures.

Referring to step 1030 and FIGS. 2C, 6A, and 8A, a dielectric passivation layer 72 may be formed over the topmost first interconnect-level dielectric material layer 660 and the first bonding pads 68.

Referring to step 1040 and FIGS. 2D-2L, 3, 4, 5A, 5B, 6B-6E, 7, 8A-8I, and 9, forming first metal bump structures 80 may be formed on the first bonding pads 68 through the dielectric passivation layer 72. Each of the first metal bump structures 80 comprises a contoured bottom surface including a bottommost surface segment BSS in contact with a top surface of a respective one of the bonding pads 68, and an annular surface segment ASS1 that overlies the dielectric passivation layer 72 and having an inner periphery that is laterally offset inward from an outer periphery by a lateral offset distance that is at least 8% of a width of a respective underlying one of the first bonding pads.

Referring to all drawings and according to various embodiments of the present disclosure, a semiconductor structure may include a semiconductor die 700, wherein the semiconductor die 700 includes: metal interconnect structures located within interconnect-level dielectric material layers (610, 620, 630, 640, 650, 660); bonding pads 68 located on a topmost interconnect-level dielectric material layer 660 and electrically connected to a respective one of the metal interconnect structures; a dielectric passivation layer 72 located on the topmost interconnect-level dielectric material layer 660, wherein the dielectric passivation layer 72 comprises a dielectric passivation material blocking diffusion of hydrogen and moisture; and metal bump structures 80 extending through the dielectric passivation layer 72 and located on the bonding pads 68, wherein each of the metal bump structures 80 comprises a contoured bottom surface including a bottommost surface segment BSS in contact with a top surface of a respective one of the bonding pads 68, a tapered surface segment TSS1 in contact with a tapered sidewall of a respective opening through the dielectric passivation layer 72, and an annular surface segment ASS1 that overlies the dielectric passivation layer 72 and having an inner periphery that is laterally offset inward from an outer periphery by a lateral offset distance that is at least 8% of a width PW of a respective underlying one of the bonding pads 68.

In one embodiments, the dielectric passivation layer may include a horizontally-extending segment contacting the topmost interconnect-level dielectric material layer, vertically-extending segments contacting sidewalls of the bonding pads, and capping segments contacting an annular peripheral portion of a top surface of each of the bonding pads. In one embodiment, the semiconductor structure may further include a capping dielectric material layer overlying the dielectric passivation layer, wherein each of the metal bump structures comprises an additional tapered surface segment in contact with a tapered sidewall of a respective opening through the capping dielectric material layer. In one embodiment, the capping dielectric material layer may include an additional dielectric passivation material. In one embodiment, each of the dielectric passivation material and the additional dielectric passivation material may be selected from silicon nitride and silicon carbide nitride. In one embodiment, the capping dielectric material may include a polymer material. In one embodiment, the capping dielectric material layer may include a horizontal top surface that extends over areas that are not covered by the metal bump structures. In one embodiment, the annular surface segment of each of the metal bump structures may contact a respective annular surface segment of the capping dielectric material layer; and each of the metal bump structures may include an additional annular surface segment in contact with a respective annular surface segment of a top surface of a capping segment of the dielectric passivation layer that overlies a respective one of the bonding pads. In one embodiment, the annular surface segment of each of the metal bump structures may contact a respective annular surface segment of the dielectric passivation layer. In one embodiment, each of the metal bump structures may be located entirely within an area of the respective underlying one of the bonding pads in a plan view along a direction that is perpendicular to a top surface of the topmost interconnect-level dielectric material layer. In one embodiment, the semiconductor structure may also include an interconnect-containing structure that may include additional metal bump structures and selected from a second semiconductor die, an interposer, or a packaging substrate, wherein the metal bump structures of the semiconductor die is bonded to the additional metal bump structures of the interconnect-containing structure through solder material portions. In one embodiment, the semiconductor structure may also include an underfill material portion contacting the solder material portions, the metal bump structures of the semiconductor die, and the additional metal bump structures of the interconnect-containing structure.

Referring to FIGS. 1-10 and according to various embodiments of the present disclosure, a semiconductor structure may include a first semiconductor die 700 and an interconnect-containing structure 200, wherein the first semiconductor die 700 includes: first metal interconnect structures located within first interconnect-level dielectric material layers (610, 620, 630, 640, 650, 660); first bonding pads 68 located on a topmost first interconnect-level dielectric material layer 660 and electrically connected to a respective one of the first metal interconnect structures; a dielectric passivation layer 72 located on the topmost first interconnect-level dielectric material layer 660 and the first bonding pads 68; and first metal bump structures 80 extending through the dielectric passivation layer 72 and located on the first bonding pads 68, wherein: each of the first metal bump structures 80 comprises a contoured bottom surface including a bottommost surface segment BSS in contact with a top surface of a respective one of the bonding pads 68, and an annular surface segment ASS1 that overlies the dielectric passivation layer 72 and having an inner periphery that is laterally offset inward from an outer periphery by a lateral offset distance that is at least 8% of a width PW of a respective underlying one of the first bonding pads 68; the interconnect-containing structure 200 comprises second metal bump structures 280 and is selected from a second semiconductor die, an interposer, or a packaging substrate; and the first metal bump structures 80 are bonded to the second metal bump structures 280 through solder material portions 130.

In one embodiment, the semiconductor structure may also include a capping dielectric material layer contacting the dielectric passivation layer and the contoured bottom surfaces of the first metal bump structures, wherein each of the metal bump structures comprises an additional tapered surface segment in contact with a tapered sidewall of a respective opening through the capping dielectric material layer, and wherein an underfill material portion contacts the capping dielectric material layer. In one embodiment, the semiconductor structure may also include an underfill material portion contacting a horizontal surface and vertical sidewalls of the dielectric passivation layer.

The metal bump structures 80 of the present disclosure use a large ratio of the first lateral offset distance ENA to the pad width PW that is at least 0.08 and uses a small ratio of the top pad opening width TPOW to the bottom pad opening width BPOW that is less than 1.30. This feature provides the benefit of suppressing delamination of the metal bump structures 80 from the dielectric passivation layer 72 and the capping dielectric material layer (74, 174) during manufacture of a semiconductor die 700, during formation of a bonded assembly, and during subsequent usage of the bonded assembly. In some embodiments, the bump configuration may reduce or prevent the interfacial delamination between UBM structures and underlying polymer material portions after a chip package reliability test and/or during operation of the chip package.

Figure 11:
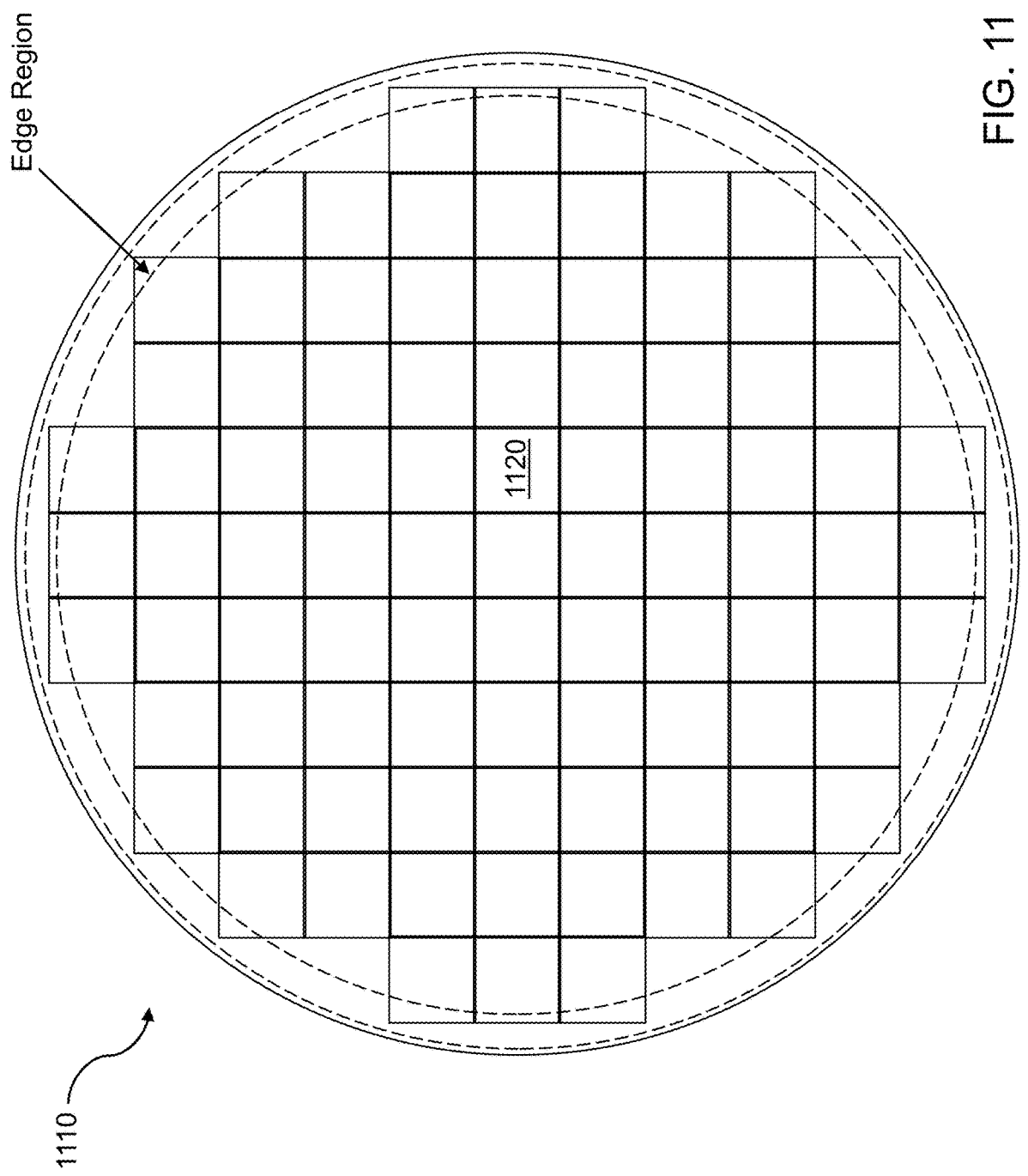
FIG. 11 is an illustration of a region of a wafer that is prone to delamination of UBM structures.

Typically, prior art packaging structures are prone to generation of a high density of delamination at the interfaces between UBM structures and polymer material portions due to small dimensions of openings in the polymer material portions. The probability of delamination between the UBM structures and the underlying polymer material portions is the highest in an annular edge region adjacent to the periphery of a wafer 1110 as illustrated in FIG. 11. Thus, a subset of the semiconductor dies 1120 including corner regions located within the annular edge region tends to have high failure rates during a reliability test or during usage due to delamination of the UBM structures. The various embodiments of the present disclosure provides configurations in which the adhesion between the UBM structures and underlying dielectric material portions is enhanced, and thus, delamination of the UBM structures is reduced. The adhesion may be enhanced through an increase in the top pad opening width TPOW relative to the lateral dimensions of the bonding pads 68, through reduction of the thickness of the capping dielectric material layer 74 (which may comprise a polymer material), through a reduction in the ratio of the top pad opening with TPOW to the bottom pad opening width BPOW, and/or additional features of the present disclosure as described above.

The various embodiments of the present disclosure enable manufacture of advanced chap package structures including highly scaled semiconductor devices such as 5 nm semiconductor devices or 3 nm semiconductor devices. Simulations show that mechanical stress at the interface between the metal bump structures 80 and the dielectric passivation layer 72 and/or the capping dielectric material layer (74, 174) may decrease by about 30% compared to prior art devices.

While the present disclosure is described using embodiments in which the dielectric passivation layer 72 and/or the capping dielectric material layer (74, 174) are formed in the first semiconductor die 700, it is understood that a mirror image structure may be formed within the interconnect-containing structure 200 of the present disclosure. Specifically, the interconnect-containing structure 200 may comprise a dielectric passivation layer 72 and/or a capping dielectric material layer (74, 174), and the second metal bump structures 280 of the interconnect-containing structure 200 may comprise the same features as the first metal bump structures 80 of the first semiconductor die 700.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising a semiconductor die, wherein the semiconductor die comprises:

a metal interconnect structure located within interconnect-level dielectric material layers;

a bonding pad located on a topmost interconnect-level dielectric material layer and electrically connected to the metal interconnect structure, wherein the bonding pad comprises a pad plate portion having a bottom surface in contact with a horizontal surface segment of a top surface of the topmost interconnect-level dielectric layer within a first horizontal plane and further comprises a via portion that vertically extends from the first horizontal plane downward through the topmost interconnect-level dielectric layer and contacts a sidewall of the topmost interconnect-level dielectric layer and contacts a top surface of the metal interconnect structure;

a dielectric passivation layer located on the top surface of the topmost interconnect-level dielectric material layer, wherein the dielectric passivation layer comprises a dielectric passivation material which is selected from silicon nitride or silicon carbide nitride, conformally covers, and contacts, all sidewall surfaces of the bonding pad, peripheral surface segments of a top surfaces of the bonding pad, and the top surface of the topmost interconnect-level dielectric layer in a vertical cross-sectional view, and has a uniform material composition throughout; and a metal bump structure extending through the dielectric passivation layer and located on the bonding pad, wherein the metal bump structure comprises a contoured bottom surface including a bottommost surface segment in contact with a top surface of the bonding pad, a tapered surface segment in contact with a tapered sidewall of an opening through the dielectric passivation layer, and an annular surface segment that overlies the dielectric passivation layer and having an inner periphery that is laterally offset inward from an outer periphery by a lateral offset distance that is at least 8% of a width of an underlying bonding pad, wherein the annular surface segment is located above, and is vertically spaced from, a second horizontal plane including topmost surface segments of the dielectric passivation layer and is in contact with a dielectric surface.

2. The semiconductor structure of claim 1, wherein the dielectric passivation layer comprises a horizontally-extending segment contacting the topmost interconnect-level dielectric material layer, vertically-extending segments contacting sidewalls of the bonding pad, and capping segments contacting an annular peripheral portion of a top surface of the bonding pad.

3. The semiconductor structure of claim 1, further comprising a capping dielectric material layer overlying the dielectric passivation layer, wherein the metal bump structure comprises an additional tapered surface segment in contact with a tapered sidewall of an opening through the capping dielectric material layer.

4. The semiconductor structure of claim 3, wherein the capping dielectric material layer comprises an additional dielectric passivation material.

5. The semiconductor structure of claim 4, wherein the additional dielectric passivation material is selected from silicon nitride or silicon carbide nitride.

6. The semiconductor structure of claim 3, wherein the capping dielectric material layer comprises a polymer material.

7. The semiconductor structure of claim 3, wherein the capping dielectric material layer comprises a horizontal top surface that extends over areas that are not covered by the metal bump structure and located within a third horizontal plane that contains the annular surface segment of the metal bump structure.

8. The semiconductor structure of claim 3, wherein:
the annular surface segment of the metal bump structure contacts an annular surface segment of the capping dielectric material layer; and
the metal bump structure comprises an additional annular surface segment in contact with an annular surface segment of a top surface of a capping segment of the dielectric passivation layer that overlies of the bonding pad.

9. The semiconductor structure of claim 1, wherein the metal bump structure is located entirely within an area of the underlying bonding pad in a plan view along a direction that is perpendicular to a top surface of the topmost interconnect-level dielectric material layer.

10. The semiconductor structure of claim 1, further comprising an interconnect-containing structure comprises an additional metal bump structure and selected from a second semiconductor die, an interposer, or a packaging substrate, wherein the metal bump structure of the semiconductor die is bonded to the additional metal bump structure of the interconnect-containing structure through solder material portions.

11. The semiconductor structure of claim 10, further comprising an underfill material portion contacting the solder material portions, the metal bump structure of the semiconductor die, and the additional metal bump structure of the interconnect-containing structure.

12. The semiconductor structure of claim 3, further comprising an underfill material portion contacting the metal bump structure of the semiconductor die, and a horizontal top surface of the capping dielectric material layer, and does not contact any surface of the dielectric passivation layer or the bonding pad, wherein an entirety of an interface between the underfill material portion and the horizontal top surface of the capping dielectric material layer is located within a third horizontal plane including the annular surface segment of the metal bump structure.

13. A semiconductor structure comprising a first semiconductor die and an interconnect-containing structure, wherein the first semiconductor die comprises:
a first metal interconnect structure located within first interconnect-level dielectric material layers;
a first bonding pad located on a topmost first interconnect-level dielectric material layer and electrically connected to the first metal interconnect structure, wherein the first bonding pad comprises a pad plate portion having a bottom surface in contact with a horizontal surface segment of a top surface of the topmost interconnect-level dielectric layer within a first horizontal plane and further comprises a via portion that vertically extends from the first horizontal plane downward through the topmost interconnect-level dielectric layer and contacts a respective sidewall of the topmost interconnect-level dielectric layer and contacts a top surface of the metal interconnect structures;
a dielectric passivation layer located on the topmost first interconnect-level dielectric material layer and the first bonding pad, wherein the dielectric passivation layer comprises a dielectric passivation material which is selected from silicon nitride or silicon carbide nitride, conformally covers, and contacts, all sidewall surfaces of the first bonding pad, peripheral surface segments of a top surface of the first bonding pad, and the top surface of the topmost interconnect-level dielectric layer in a vertical cross-sectional view, and has a uniform material composition throughout;
a first metal bump structure extending through the dielectric passivation layer and located on the first bonding pad; and
a capping dielectric material layer contacting the dielectric passivation layer and the contoured bottom surface of the first metal bump structure, wherein the first metal bump structure comprises an additional tapered surface segment in contact with a tapered sidewall of an opening through the capping dielectric material layer, and wherein an underfill material portion contacts the capping dielectric material layer, wherein:
the first metal bump structure comprises a contoured bottom surface including a bottommost surface segment in contact with a top surface of the first bonding pad, and an annular surface segment that overlies the dielectric passivation layer and having an inner periphery that is laterally offset inward from an outer periphery by a lateral offset distance that is at least 8% of a width of an underlying first bonding pad;
the annular surface segment is located above, and is vertically spaced from, a second horizontal plane including topmost surface segments of the dielectric passivation layer and is in contact with a dielectric surface;
the interconnect-containing structure comprises a second metal bump structure and is selected from a second semiconductor die, an interposer, or a packaging substrate;
the first metal bump structure is bonded to the second metal bump structure through solder material portions; and
the metal bump structure comprises an additional annular surface segment located within the second horizontal plane and in contact with an annular surface segment of a top surface of a capping segment of the dielectric passivation layer that overlies the bonding pad.

14. The semiconductor structure of claim 13, wherein: the capping dielectric material layer comprises an additional dielectric passivation material selected from silicon nitride or silicon carbide nitride.

15. The semiconductor structure of claim 14, wherein: the capping dielectric material layer comprises a horizontal top surface that extends over areas that are not covered by the first metal bump structure and located within a plane that contains the annular surface segment of the first metal bump structure.

16. A semiconductor structure comprising a semiconductor die, wherein the semiconductor die comprises:

a metal interconnect structure located within interconnect-level dielectric material layers;

a bonding pad located on a topmost interconnect-level dielectric material layer and electrically connected to the metal interconnect structure, wherein the bonding pad comprises a pad plate portion having a bottom surface in contact with a horizontal surface segment of a top surface of the topmost interconnect-level dielectric layer within a first horizontal plane and further comprises a via portion that vertically extends from the first horizontal plane downward through the topmost interconnect-level dielectric layer and contacts a sidewall of the topmost interconnect-level dielectric layer and contacts a top surface of the metal interconnect structure;

a dielectric passivation layer located on the topmost interconnect-level dielectric material layer, wherein the dielectric passivation layer comprises a dielectric passivation material which is selected from silicon nitride or silicon carbide nitride, conformally covers, and contacts, all sidewall surfaces of the bonding pads, peripheral surface segments of top surfaces of the bonding pads, and the top surface of the topmost interconnect-level dielectric layer in a vertical cross-sectional view, and has a uniform material composition throughout;

a capping dielectric material layer overlying the dielectric passivation layer; and metal bump structures extending through the dielectric passivation layer and the capping dielectric material layer and located on the bonding pad, wherein the metal bump structure comprises a contoured bottom surface including a bottommost surface segment in contact with a top surface of the bonding pad, a tapered surface segment in contact with a tapered sidewall of an opening through the dielectric passivation layer, and a first annular surface segment that contacts a second annular surface segment of the capping dielectric material layer.

17. The semiconductor structure of claim 16, wherein the dielectric passivation layer comprises a horizontally-extending segment contacting the topmost interconnect-level dielectric material layer, vertically-extending segments contacting sidewalls of the bonding pad, and capping segments contacting an annular peripheral portion of a top surface of the bonding pad.

18. The semiconductor structure of claim 16, wherein the metal bump structure comprises an additional tapered surface segment in contact with a tapered sidewall of a respective opening through the capping dielectric material layer.

19. The semiconductor structure of claim 18, wherein the capping dielectric material layer comprises an additional dielectric passivation material that is selected from silicon nitride or silicon carbide nitride.

20. The semiconductor structure of claim 16, wherein:

the metal bump structure comprises an additional annular surface segment which is located within a second horizontal plane including topmost surface segments of the dielectric passivation layer and is in contact with a respective annular surface segment of a top surface of a capping segment of the dielectric passivation layer that overlies the bonding pad; and the annular surface segment of the metal bump structure is located within a third horizontal plane including a top surface of the capping dielectric material layer.

* * * * *